(12) United States Patent
Sato

(10) Patent No.: US 10,854,244 B2
(45) Date of Patent: Dec. 1, 2020

(54) SEMICONDUCTOR MEMORY DEVICE

(71) Applicant: Toshiba Memory Corporation, Minato-ku (JP)

(72) Inventor: Jumpei Sato, Kawasaki (JP)

(73) Assignee: Toshiba Memory Corporation, Minato-ku (JP)

(*) Notice: Subject to any disclaimer, the term of this patent is extended or adjusted under 35 U.S.C. 154(b) by 0 days.

(21) Appl. No.: 16/573,635

(22) Filed: Sep. 17, 2019

(65) Prior Publication Data
US 2020/0013435 A1 Jan. 9, 2020

Related U.S. Application Data

(63) Continuation of application No. 16/101,859, filed on Aug. 13, 2018, now Pat. No. 10,460,770.

(30) Foreign Application Priority Data

Mar. 22, 2018 (JP) .................. 2018-054562

(51) Int. Cl.

| | |
|---|---|
| *G11C 5/06* | (2006.01) |
| *G11C 8/08* | (2006.01) |
| *G11C 11/4097* | (2006.01) |
| *G11C 11/4091* | (2006.01) |
| *G11C 11/4096* | (2006.01) |
| *G11C 11/4074* | (2006.01) |

(52) U.S. Cl.
CPC .............. *G11C 5/063* (2013.01); *G11C 8/08* (2013.01); *G11C 11/4074* (2013.01); *G11C 11/4091* (2013.01); *G11C 11/4096* (2013.01); *G11C 11/4097* (2013.01)

(58) Field of Classification Search
CPC ....... G11C 5/063; G11C 8/08; G11C 11/4074; G11C 11/4091
USPC .......................................................... 365/63
See application file for complete search history.

(56) References Cited

U.S. PATENT DOCUMENTS

| | | | |
|---|---|---|---|
| 6,717,270 B1 | 4/2004 | Downey | |
| 6,822,316 B1 * | 11/2004 | Hsuan | H01L 23/481 257/621 |
| 7,531,903 B2 | 5/2009 | Kao | |

(Continued)

FOREIGN PATENT DOCUMENTS

| | | |
|---|---|---|
| JP | 2011-243736 | 12/2011 |
| JP | 2015-207730 | 11/2015 |

(Continued)

*Primary Examiner* — Vu A Le
(74) *Attorney, Agent, or Firm* — Oblon, McClelland, Maier & Neustadt, L.L.P.

(57) ABSTRACT

A semiconductor memory device includes n interconnect layers above a substrate; and a first interconnect region between an end of a control circuit and an end of the substrate in a direction of a first axis beside a first pad region in a direction of a second axis. The n interconnect layers are located at different levels from the substrate. Each of the n interconnect layers includes an interconnect. The first interconnect region includes no transistor, and no contact coupled to the substrate. The first interconnect region includes an interconnect extending along the second axis in m (m is a natural number equal to or larger than 3, larger than n/2, and equal to or smaller than n) interconnect layers of the n interconnect layers.

8 Claims, 17 Drawing Sheets

(56) References Cited

U.S. PATENT DOCUMENTS

| | | | |
|---|---|---|---|
| 8,043,894 B2* | 10/2011 | Tay | H01L 25/03 |
| | | | 438/109 |
| 8,188,545 B2* | 5/2012 | Saiki | G02F 1/13452 |
| | | | 257/355 |
| 8,203,904 B2 | 6/2012 | Jang et al. | |
| 9,520,176 B2 | 12/2016 | Yamagami | |
| 2003/0173674 A1 | 9/2003 | Nakamura | |
| 2006/0198196 A1* | 9/2006 | Abe | G11C 16/0483 |
| | | | 365/185.18 |

FOREIGN PATENT DOCUMENTS

| | | | |
|---|---|---|---|
| TW | 200605302 A | 5/2002 | |
| TW | 535277 B | 6/2003 | |
| TW | 200605302 A | 2/2006 | |

* cited by examiner

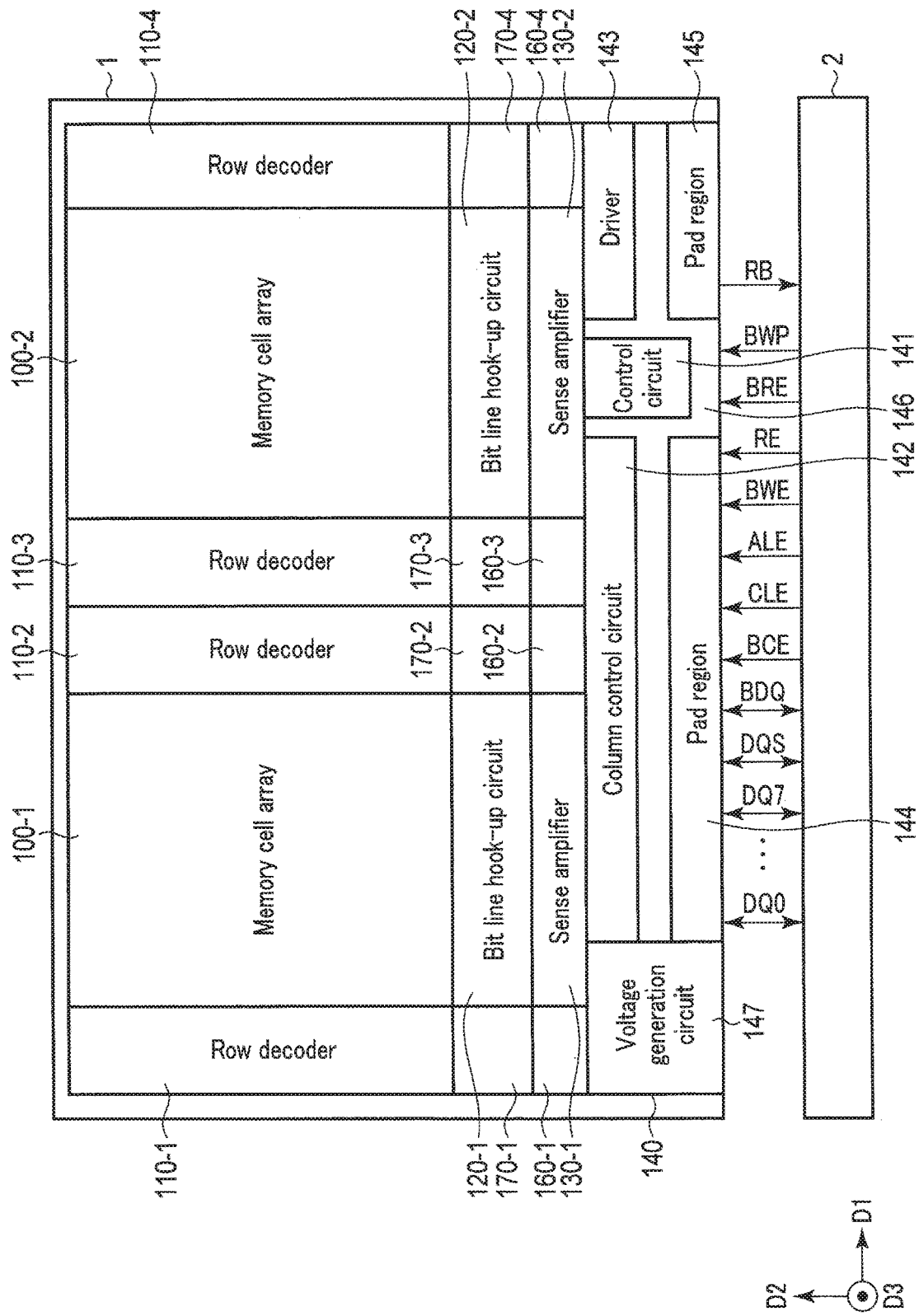
F I G. 1

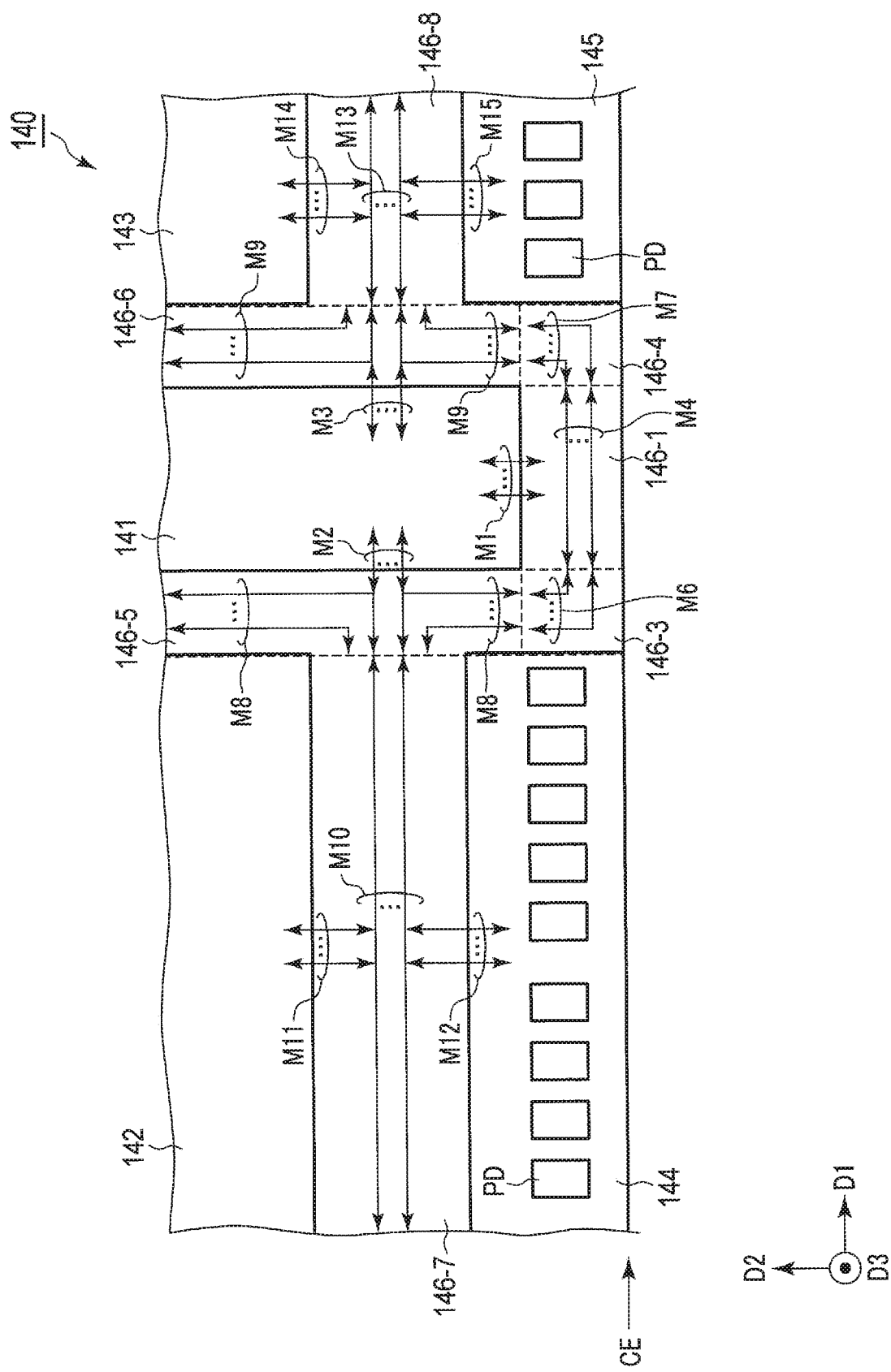
F I G. 12

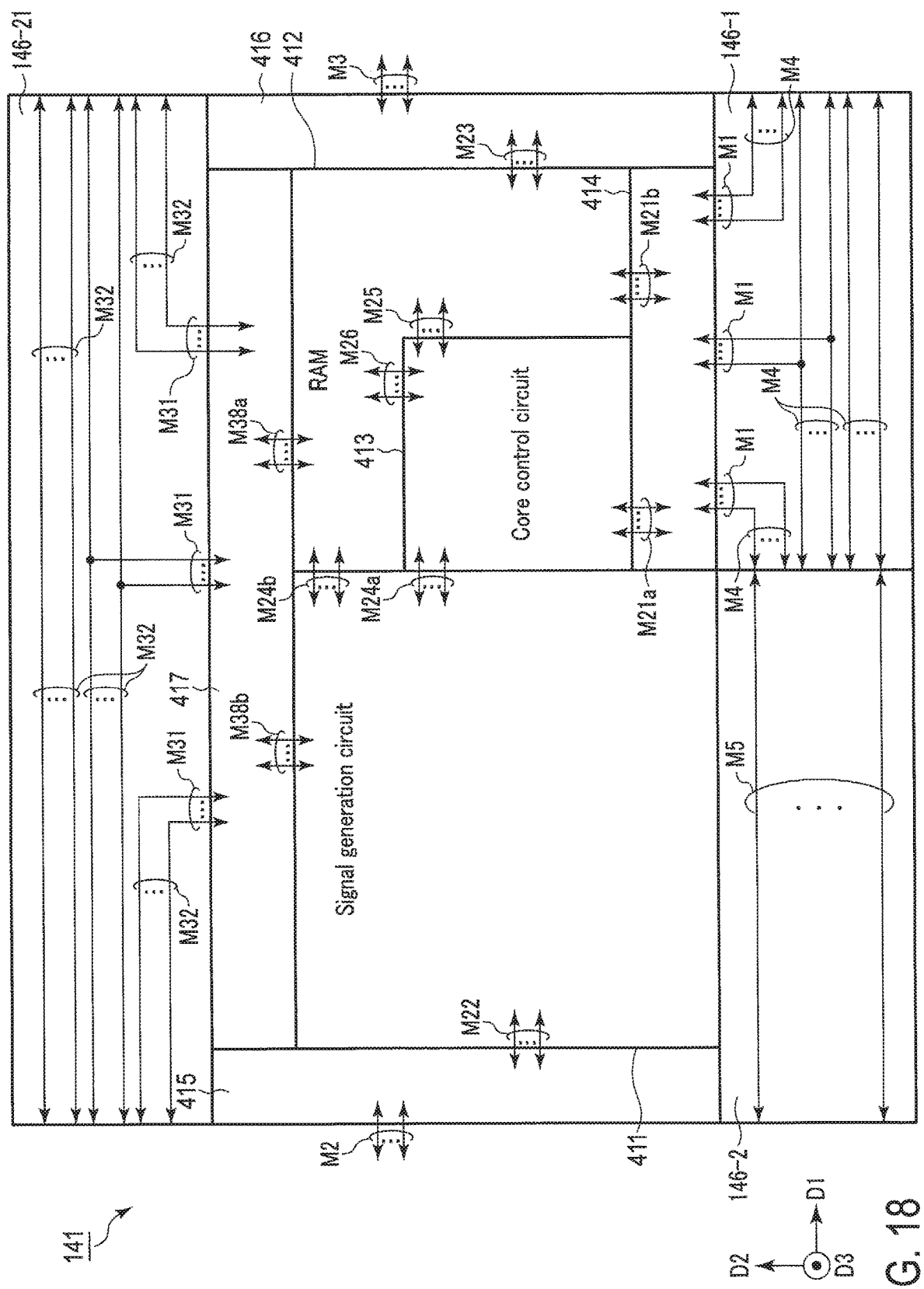

SEMICONDUCTOR MEMORY DEVICE

CROSS-REFERENCE TO RELATED APPLICATIONS

This application is a continuation application of and claims the benefit of priority under 35 U.S.C. § 120 for U.S. Ser. No. 16/101,859, filed on Aug. 13, 2018, which claims the benefit of priority from Japanese Patent Application No. 2018-54562, filed Mar. 22, 2018. The entire contents of each of which are incorporated herein by reference.

FIELD

Embodiments described herein relate generally to a semiconductor memory device.

BACKGROUND

In recent years, there has been a demand for finer semiconductor memory devices.

BRIEF DESCRIPTION OF THE DRAWINGS

FIG. 1 is a plan view illustrating the configuration of a memory system which includes a semiconductor memory device according to a first embodiment;

FIG. 12 illustrates a planar structure of a part of a peripheral circuit of a semiconductor memory device according to a first modification of the first embodiment;

FIG. 18 illustrates a planar structure of a part of a control circuit of a semiconductor memory device according to a modification of the second embodiment.

DETAILED DESCRIPTION

Figure 2:
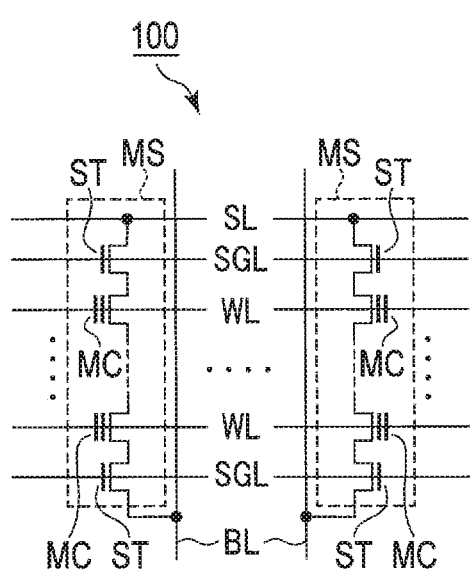
FIG. 2 illustrates components and coupling of a memory cell array according to the first embodiment.

According to an embodiment, a semiconductor memory device includes a substrate; a control circuit on the substrate; a first pad region comprising a pad above the substrate; n (n is a natural number equal to or larger than 3) interconnect layers above the substrate; and a first interconnect region between an end of the control circuit and an end of the substrate in a direction of a first axis beside the first pad region in a direction of a second axis. The control circuit includes a transistor. The n interconnect layers is located at different levels from the substrate. Each of the n interconnect layers includes an interconnect. The first interconnect region includes no transistor, and no contact coupled to the substrate. The first interconnect region includes an interconnect extending along the second axis in m (m is a natural number equal to or larger than 3, larger than n/2, and equal to or smaller than n) interconnect layers of the n interconnect layers.

Hereinbelow, embodiments, which have been constructed, will be described with reference to the drawings. In the following description, components having substantially the same function and configuration are denoted by the same reference sign. The "-X (X is any number)" following a numeral constituting a reference sign is used for distinguishing between components that are referred to by reference signs including the same numeral and have similar configurations. When it is not necessary to distinguish between components referred to by reference signs including the same numeral, these components are referred to by a reference sign including only a numeral. For example, when it is not necessary to distinguish between components denoted by reference signs 100-1 and 100-2, these components are comprehensively referred to by a reference sign 100.

It should be noted that each drawing is a schematic drawing, and the relationship between a thickness and a planar dimension and the ratio in thickness between layers differ from actual ones. Thus, actual thicknesses and dimensions should be determined taking the following description into consideration. Further, it is needless to say that the relationship in dimension and the ratio between drawings may also differ from actual ones.

Hereinbelow, in the present specification, an XYZ orthogonal coordinate system is used for convenience of description. In the coordinate system, two axes that are parallel to the upper face of a semiconductor substrate Sub (described below) and perpendicular to each other are referred to as a D1 axis (X) and a D2 axis (Y), and an axis that is perpendicular to both of the D1 axis and the D2 axis, that is, the axis extending in the direction in which layers are stacked is referred to as a D3 axis (Z). Hereinbelow, "height" indicates a length along the D3 axis.

<1> First Embodiment

A semiconductor memory device according to a first embodiment will be described.

<1-1> Configuration of Memory System

First, the configuration of a memory system which includes a semiconductor memory device according to the present embodiment will be described with reference to FIG. 1. FIG. 1 illustrates the memory system which includes the semiconductor memory device according to the embodiment, and particularly, illustrates some components of the semiconductor memory device and the layout thereof.

As illustrated in FIG. 1, the memory system includes a NAND type flash memory 1 and a memory controller 2. For example, the memory controller 2 and the HAND type flash memory 1 may constitute a single semiconductor device by a combination thereof. Examples of the semiconductor device include a memory card such as an SD (trademark) card and a solid state drive (SSD). The memory system may further include a host (not illustrated).

The NAND type flash memory 1 is formed on a semiconductor substrate Sub (not illustrated), includes memory cells, and stores data in a nonvolatile manner. The memory controller 2 is coupled to the NAND type flash memory 1 through a NAND bus and coupled to the host through a host bus. The memory controller 2 controls the NAND type flash memory 1 and makes access to the NAND type flash memory 1 in response to an instruction received from the host. The host is, for example, a digital camera or a personal computer. The host bus is, for example, a bus in compliance with an SD interface.

The NAND bus transmits signals according to a NAND interface. Specific examples of the signals include a chip enable signal BCE, a command latch enable signal CLE, an address latch enable signal ALE, a write enable signal BWE, read enable signals RE and BRE, a write protect signal BWP, data strobe signals DQS and BDQS, a ready/busy signal RB, and input and output signals DQ (DQ0 to DQ7). The data strobe signal BDQS is a complementary signal of the data strobe signal DQS.

<1-1-1> Entire Configuration of NAND Type Flash Memory

The configuration of the NAND type flash memory (semiconductor memory device) 1 according to the embodiment will be described with reference to FIG. 1.

FIG. 1 also illustrates the layout of the NAND type flash memory 1 according to the embodiment along the D1 axis and the D2 axis. As illustrated in FIG. 1, the NAND type flash memory 1 has, for example, a rectangular shape. The NAND type flash memory 1 includes memory cell arrays 100-1 and 100-2, row decoders 110-1 to 110-4, bit line hook-up circuits 120-1 and 120-2, sense amplifiers 130-1 and 130-2, a peripheral circuit 140, and hook-up regions 160-1 to 160-4 and 170-1 to 170-4.

The peripheral circuit 140 has, for example, a rectangular shape and extends along one side (the side along the D1 axis (e.g., the lower side in FIG. 1)) of the NAND type flash memory 1. The peripheral circuit 140 is disposed on the edge of the NAND type flash memory 1. The peripheral circuit 140 extends over to two sides of the NAND type flash memory 1, the two sides extending along the D2 axis. The memory controller 2 and the NAND type flash memory 1 are coupled to each other through the peripheral circuit 140. The peripheral circuit 140 receives control signals and commands and controls the NAND type flash memory 1 in accordance with the received control signals and commands. Specifically, the peripheral circuit 140 controls the memory cell arrays 100, the row decoders 110, the bit line hook-up circuits 120, and the sense amplifiers 130.

The peripheral circuit 140 includes a control circuit 141, a column control circuit 142, a driver 143, pad regions 144 and 145, an interconnect region (interconnect exclusive path) 146, and a voltage generation circuit 147. The voltage generation circuit 147 is located on the left end of the peripheral circuit 140. The voltage generation circuit 147 includes, for example, a charge pump, and raises a power supply voltage in accordance with commands of the control circuit 141 and supplies the raised voltages to components in the NAND type flash memory 1.

Each of the pad regions 144 and 145 has, for example, a rectangular shape. The pad regions 144 and 145 are located on the lower end of the peripheral circuit 140 and disposed side by side with an interval therebetween in the direction along the D1 axis. The left end of the pad region 144 abuts on the right end of the voltage generation circuit 147. The pad region 145 is located on the right end of the peripheral circuit 140. The pad regions 144 and 145 include pads PD (not illustrated). Each of the pads PD receives or outputs one of the chip enable signal BCE, the command latch enable signal CLE, the address latch enable signal ALE, the write enable signal BWE, the read enable signals RE and BRE, the write protect signal BWP, the data strobe signals DQS and BDQS, the ready/busy signal RB, the input and output signals DQ, and a power supply voltage.

The column control circuit 142 has, for example, a rectangular shape, and is located on the upper end of the peripheral circuit 140. The column control circuit 142 and the pad region 144 are disposed side by side with an interval therebetween in the direction along the D2 axis. The column control circuit 142 generates and outputs signals for controlling columns of the memory cell arrays 100-1 and 100-2.

The driver 143 has, for example, a rectangular shape, and is located on the upper end of the peripheral circuit 140. The driver 143 and the pad region 145 are disposed side by side with an interval therebetween in the direction along the D2 axis. The driver 143 transfers voltages to word lines and select gate lines of the memory cell arrays 100-1 and 100-2.

The control circuit 141 has, for example, a rectangular shape, and is located between an area between the column control circuit 142 and the driver 143 and an area between the pad region 144 and the pad region 145. The control circuit 141 receives control signals and commands from the pad region 144 and the pad region 145 and controls the NAND type flash memory 1 in accordance with the received control signals and commands. Specifically, the control circuit 141 generates internal control signals based on the control signals and the commands and transmits the internal control signals to the column control circuit 142 and the driver 143. The control circuit 141 generates external output signals which are output from the NAND type flash memory 1. The external output signals include, for example, the ready/busy signal RB, the input and output signal DQ, and the data strobe signals DQS and BDQS.

The interconnect region 146 includes a region other than the control circuit 141, the column control circuit 142, the driver 143, the pad regions 144 and 145, and the voltage generation circuit 147 in the peripheral circuit 140. More specifically, the interconnect region 146 includes the following sections. The interconnect region 146 includes an area between the lower end of the column control circuit 142 and the upper end of the pad region 144. The interconnect region 146 further includes an area between the lower end of the driver 143 and the upper end of the pad region 145.

The interconnect region 146 further includes an area along the periphery of the control circuit 141. More specifically, the interconnect region 146 includes an area between the left end of the control circuit 141 and the right end of the column control circuit 142. The interconnect region 146 includes an area surrounded by the control circuit 141, the column control circuit 142, and the pad region 144. The interconnect region 146 includes a area surrounded by the lower end of the control circuit 141, the right end of the pad region 144, and the left end of the pad region 145. The interconnect region 146 include an area surrounded by the control circuit 141, the driver 143, and the pad region 145. The interconnect region 146 includes an area between the right end of the control circuit 141 and the left end of the driver 143.

The interconnect region 146 includes interconnects for transmitting signals and voltages between components in the peripheral circuit 140. The interconnect region 146 includes no transistor and no contact connected to the substrate Sub.

Each of the memory cell array 100 (each of memory cell array 100-1 and 100-2) has, for example, a rectangular shape. The memory cell array 100 is located on the upper end of the NAND type flash memory 1. As illustrated in FIG. 2, the memory cell array 100 includes memory strings MS. Each of the memory strings MS includes a select transistor ST, memory cell transistors MC, and a select transistor ST which are coupled in series. One of the transistors ST is coupled to a source line SL, and the other transistor ST is coupled to a bit line BL. Each of the memory cell transistors MC stores data in a nonvolatile manner. For example, each of the memory cell transistors MC includes a stacked gate which includes a control gate electrode and a charge storage layer (e.g., a floating gate electrode) and stores binary or multivalued data according to a change in a threshold of the memory cell transistor MC which is determined by the amount of charge injected into the floating gate electrode thereof. The control gate electrodes of the memory cell transistors MC are coupled to a word line WL, and gate electrodes of the select transistors ST are coupled to a select gate line SGL. The memory cell transistors MC may be two-dimensionally arrayed or three-dimensionally arrayed.

Referring back to FIG. 1, each of the row decoders 110-1 and 110-2 has, for example, a rectangular shape. The row decoders 110-1 and 110-2 extend in the direction along the D2 axis and sandwich the memory cell array 100-1 therebetween in the direction along the D1 axis. The row decoders 110-1 and 110-2 select a block BLK of the memory cell array 100-1 during a read operation, a write operation, or an erase operation for data. The row decoders 110-1 and 110-2 transfer voltages required in the read operation, the write operation, or the erase operation to the word lines WL and the select gate lines SGL of the memory cell array 100-1.

Each of the row decoders 110-3 and 110-4 has, for example, a rectangular shape. The row decoders 110-3 and 110-4 extend in the direction along the D2 axis and sandwich the memory cell array 100-2 therebetween in the direction along the D1 axis. Similarly to the row decoders 110-1 and 110-2, the row decoders 110-3 and 110-4 select a block BLK of the memory cell array 100-2 during a read operation, a write operation, or an erase operation for data. The row decoders 110-3 and 110-4 transfer voltages required in the read operation, the write operation, or the erase operation to the word lines WL and the select gate lines SGL of the memory cell array 100-2.

The bit line hook-up circuit 120-1 is disposed along the memory cell array 100-1 in the direction along the D2 axis beside the memory cell array 100-1. The bit line hook-up circuit 120-1 includes transfer transistors which transfer signals between the bit lines BL in the memory cell array 100-1 and the sense amplifier 130-1. The bit line hook-up circuit 120-1 controls coupling between the bit lines BL and the sense amplifier 130-1 in accordance with control signals received through the hook-up regions 170-1 and 170-2.

Similarly, the bit line hook-up circuit 120-2 is disposed along the memory cell array 100-2 in the direction along the D2 axis beside the memory ceil array 100-2. The bit line hook-up circuit 120-2 includes transfer transistors which transfer signals between the bit lines BL in the memory ceil array 100-2 and the sense amplifier 130-2. The bit line hook-up circuit 120-2 controls coupling between the bit lines BL and the sense amplifier 130-2 in accordance with control signals received through the hook-up regions 170-3 and 170-4.

The sense amplifier 130-1 is disposed along the bit line hook-up circuit 120-1. The sense amplifier 130-1 and the memory cell array 100-1 sandwich the bit line hook-up circuit 120-1 therebetween in the direction along the D2 axis. The sense amplifier 130-2 is disposed along the bit line hook-up circuit 120-2. The sense amplifier 130-2 and the memory cell array 100-2 sandwich the bit line hook-up circuit 120-2 therebetween in the direction along the D2 axis. The sense amplifier 130 includes sense circuits (not illustrated) which sense voltages of the bit lines BL in the memory cell array 100 and data storage circuits (not illustrated) for latching read data or data for writing. The sense amplifier 130-1 senses data of the memory cell transistors MC in the memory cell array 100-1 through the bit lines BL. The sense amplifier 130-2 senses data of the memory cell transistors MC in the memory cell array 100-2 through the bit lines BL.

The hook-up regions 170 (170-1 to 170-4) receive word line drive signals from the peripheral circuit 140 and transmit the received word line drive signals to the row decoder 110.

The hook-up regions 160-1 and 160-2 receive column control signals from the peripheral circuit 140 and transmit the received column control signals to the sense amplifier 130-1. The hook-up regions 160-3 and 160-4 receive column control signals from the peripheral circuit 140 and transmit the received column control signals to the sense amplifier 130-2.

<1-1-2> Configuration of Peripheral Circuit

Figure 3:
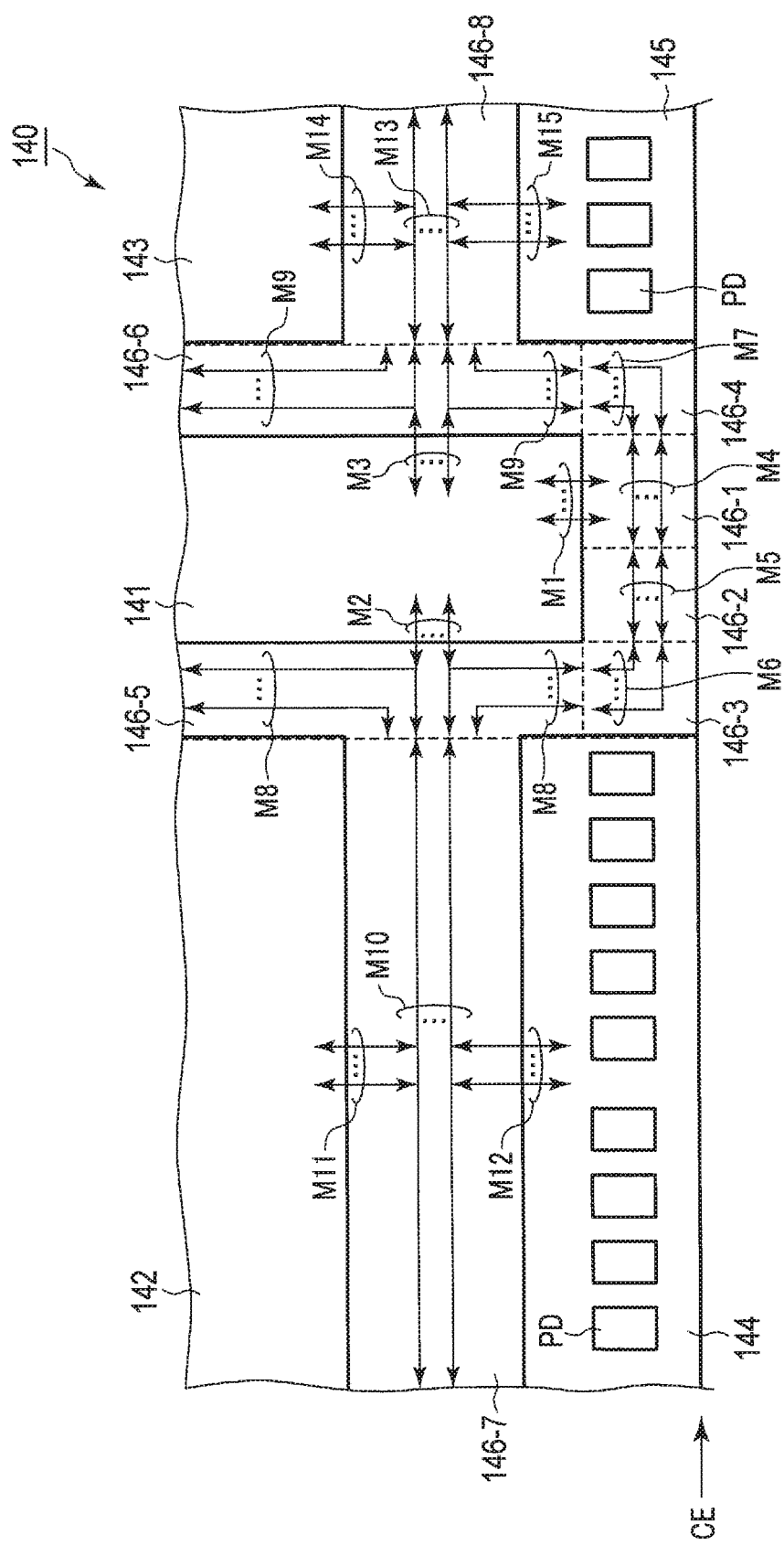
FIG. 3 illustrates a planar structure of a part of a peripheral circuit of the semiconductor memory device according to the first embodiment.

The peripheral circuit 140 will now be described with reference to FIG. 3. FIG. 3 illustrates a part of the peripheral circuit 140 of the first embodiment along the D1 axis and the D2 axis, particularly, the surroundings of the control circuit 141, and further illustrates interconnects for electrically coupling components to each other.

As illustrated in FIG. 3, the pad regions 144 and 145 include pads PD. The pads PD are disposed side by side at intervals along the D1 axis. The pad regions 144 and 145 output data strobe signals DQS and BDQS and output signals DQ at the pads PD. Further, the pad regions 144 and 145 receive the chip enable signal BCE, the command latch enable signal CLE, the address latch enable signal ALE, the write enable signal BWE, the read enable signals RE and BRE, the write protect signal BWP, and the data strobe signals DQS and BDQS at the pads PD.

The interconnect region 146 includes interconnect regions 146-1, 146-2, 146-3, 146-4, 146-5, 146-6, 146-7, and 146-8. First, the disposition of the interconnect regions 146-1 to 146-8 will be described.

The interconnect regions 146-1, 146-2, 146-3, and 146-4 are located on a lower end CE of the NAND type flash memory 1. The interconnect regions 146-3, 146-2, 146-1, and 146-4 are adjacent to each other in this order from the left. The interconnect region 146-3 abuts on the pad region 144. The interconnect regions 146-2 and 146-1 abut on the control circuit 141, and are located between the control circuit 141 and the lower end CE. The interconnect region 146-4 abuts on the pad region 145.

The interconnect region 146-5 is located on the left side of the control circuit 141 and extends along the left end of the control circuit 141. The interconnect region 146-5 extends over from an area between the pad region 144 and the control circuit 141 to an area between the column control circuit 142 and the control circuit 141 on the upper side of the interconnect region 146-3.

The interconnect region 146-6 is located on the right side of the control circuit 141 and extends along the right end of the control circuit 141. The interconnect region 146-6 extends over from an area between the pad region 145 and the control circuit 141 to an area between the driver 143 and the control circuit 141 on the upper side of the interconnect region 146-4.

The interconnect region 146-7 occupies an area between the column control circuit 142 and the pad region 144. The interconnect region 146-8 occupies an area between the driver 143 and the pad region 145.

The interconnect regions 146-1 to 146-8 include interconnects described below, and two interconnect regions 146 in each of some pairs of the interconnect regions 146-1 to 146-8 are electrically coupled to each other through interconnects described below.

The interconnect region 146-1 includes an interconnect croup M4. The interconnect group M4 includes any one or more interconnects which are located on each of one or more of three or more interconnect layers which are located at different levels.

Figure 4:
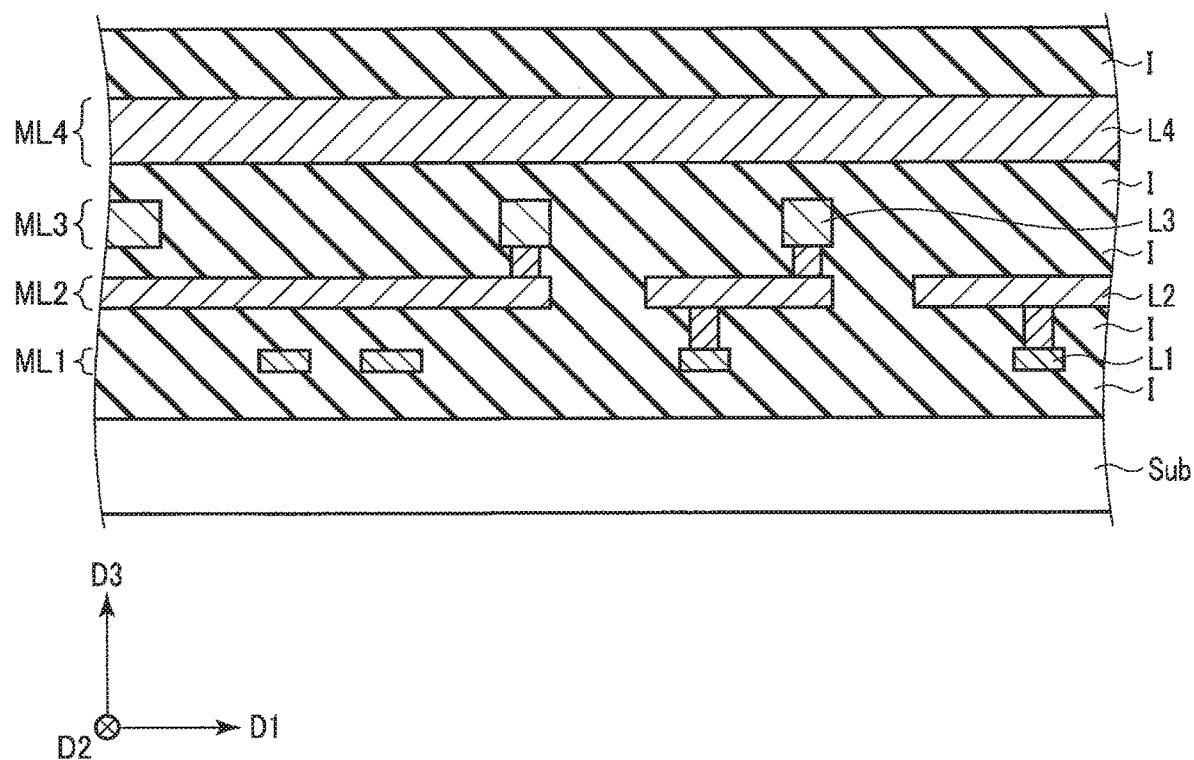
FIG. 4 illustrates a cross-sectional structure of a part of the semiconductor memory device according to the first embodiment.

Here, the interconnect layers will be described. As illustrated in FIG. 4, the NAND type flash memory 1 includes interconnect layers ML. FIG. 4 illustrates a cross-sectional structure of a part of the NAND type flash memory 1 of the first embodiment and illustrates four interconnect layers ML1 to ML4 in total as an example. The interconnect layer ML1 is located above the substrate Sub and includes interconnects L1. The interconnect layer ML2 is located at a higher position (a position more distant from the substrate Sub) than the interconnect layer ML1 and includes interconnects L2. The interconnect layer ML3 is located at a higher position than the interconnect layer ML2 and includes interconnects L3. The interconnect layer ML4 is located at a higher position than the interconnect layer ML3 and includes interconnects L4. Insulators I are disposed between the interconnect layers ML1 and ML2, between the interconnect layers ML2 and ML3, and between the interconnect layers ML3 and ML4. That is, each of the interconnect layers ML (any of ML1 to ML4) refers to as a layer that corresponds to an area between upper and lower insulators I and includes interconnects L (any of L1 to L4). The case of three or five or more interconnect layers can be easily analogized from this definition. The interconnect layers described herein do not include a layer that includes redistributions (or, redistribution layer, or redistribution interconnect) electrically coupled to none of the components in the NAND type flash memory 1.

Hereinbelow, for the purpose of simplifying description and facilitating understanding, description will be given of an example in which the NAND type flash memory 1 includes four interconnect layers. The NAND type flash memory 1 may include three or five or more interconnect layers. The four interconnect layers include a first interconnect layer, a second interconnect layer, a third interconnect layer, and a fourth interconnect layer. The first interconnect layer, the second interconnect layer, the third interconnect layer, and the fourth interconnect layer correspond to the interconnect layers ML1, ML2, ML3, and ML4 of FIG. 4, respectively, and, hereinbelow, may be referred to as the first interconnect layer ML1, the second interconnect layer ML2, the third interconnect layer ML3, and the fourth interconnect layer ML4, respectively. Similarly, an interconnect in the first interconnect layer ML1 may be referred to as a first interconnect L1, an interconnect in the second interconnect layer ML2 may be referred to as a second interconnect L2, an interconnect in the third interconnect layer MLS may be referred to as a third interconnect L3, and an interconnect in the fourth interconnect layer ML4 may be referred to as a fourth interconnect L4. An interconnect layer that is not limited to any of the first to fourth interconnect layers ML1 to ML4 and represents any one or more Gf the first to fourth interconnect layers ML1 to ML4 is referred to as an interconnect layer ML. An interconnect that is not limited to any of the first to the fourth interconnects L1 to L4 and represents any one or more of the first to the fourth interconnects L1 to L4 is referred to as an interconnect L.

All interconnects L extend along the D1 axis in more than half (three in the present example) of all interconnect layers (four interconnect layers in the present example) ML in the interconnect group M4. That is, for example, except for the second interconnect layer ML2, all first interconnects L1 in the first interconnect layer ML1, all third interconnects L3 in the third interconnect layer ML3, and all fourth interconnects L4 in the fourth interconnect layer ML4 extend along the D1 axis. On the other hand, at least some second interconnects L2 in the second interconnect layer ML2 extend along an axis that differs from the D1 axis, for example, along the D2 axis.

Alternatively, all interconnects L may extend along the D1 axis in all of the interconnect layers in the interconnect group M4.

When the NAND type flash memory 1 includes only three interconnect layers: the first interconnect layer ML1; the second interconnect layer ML2; and the third interconnect layer ML3 in total, all interconnects L extend along the D1 axis in all of the first to third interconnect layers ML1 to ML3 in the interconnect group M4.

As a generalized characteristic, when the NAND type flash memory 1 includes n (3≤n) interconnect layers ML, all interconnects L in m (n/2<m≤n and 3≤n) interconnect layers ML can extend along the D1 axis. In particular, when n is an odd number, all interconnects L in m (n/2+1<m≤n and 3≤n) interconnect layers ML can extend along the D1 axis.

Referring back to FIG. 3, the interconnects L in the interconnect region 146-1 include interconnects L that are electrically coupled to the control circuit 141 and interconnects L that are not electrically coupled to the control circuit 141.

The interconnect region 146-1 shares an interconnect croup M1 with the control circuit 141. That is, a section (e.g., one end) of each interconnect L of the interconnect croup M1 is located inside the control circuit 141, and another section (e.g., the other end) thereof is located inside the interconnect region 146-1. The interconnect croup M1 extends along the D2 axis and is made of any one or more of interconnects L of the first interconnects L1, the second interconnects L2, the third interconnects L3, and the fourth interconnects L4. Each of some first interconnects L1 of the interconnect group M1 may be directly coupled to one first interconnect of the interconnect group M4. Similarly, each of some second interconnects L2, each of some third interconnects L3, and each of some fourth interconnects L4 of the interconnect croup M1 may be directly coupled to one second interconnect L2, one third interconnect L3, and one fourth interconnect L4 of the interconnect group M4, respectively. FIG. 3 does not necessarily represent the position of the interconnect group M1 and merely schematically illustrates the direction in which the interconnects L of the interconnect group M1 extends, an area where the interconnects L of the interconnect group M1 are disposed, and/or two areas over which the interconnects L of the interconnect group M1 extends. That is, the position of the interconnect group M1 at the boundary between the interconnect region 146 and the control circuit 141 is not limited to the position illustrated in the drawing. The same applies to any interconnect group $M\alpha$ ($\alpha$ is a natural number equal to or larger than 1 or a set of a natural number equal to or larger than 1 and a letter of the alphabet).

The interconnect region 146-1 further includes contacts C. Each of the contacts C couples one interconnect L of the interconnect group M1 to one interconnect L of the interconnect group M4. Some interconnects L of the interconnect group M1 may be coupled to components in the control circuit 141 through the contacts C.

The interconnect region 146-2 includes an interconnect croup M5. The interconnect group M5 is made of any one or more of interconnects L of the first interconnects L1, the second interconnects L2, the third interconnects L3, and the fourth interconnects L4. One first interconnect L1, one second interconnect L2, one third interconnect L3, and one fourth interconnect L4 of the interconnect group M5 may be coupled to one first interconnect L1, one second interconnect L2, one third interconnect L3, and one fourth interconnect L4 of the interconnect group M4, respectively. As described above and also described below, the interconnect group $M\alpha$ may not include any one or more of the first to fourth interconnects L1 to L4 in all cases where $\alpha$ is a natural number equal to or larger than 1 or a set of a natural number equal to or larger than 1 and a letter of the alphabet. However, hereinbelow, for description including a case where all of the first to fourth interconnects L1 to L4 are provided, the description will be made assuming that each interconnect group $M\alpha$ includes the first to fourth interconnects L1 to L4. This does not mean that it is required that the interconnect croup $M\alpha$ includes all of the first to fourth interconnects L1 to L4 in all cases where $\alpha$ is a natural number equal to or larger than 1 or a set of a natural number equal to or larger than 1 and a letter of the alphabet. On the other hand, when an interconnect region $146\beta$ ($\beta$ is a natural number of 1 to 8) includes an interconnect $L\alpha$ which reaches a boundary with an interconnect region $146\gamma$ ($\gamma=\beta\pm1$) next to the interconnect region $146\beta$, the interconnect region $146\gamma$ may also include the interconnect $L\alpha$. This is because the interconnect in the interconnect region $146\beta$ needs to be coupled to the interconnect in the interconnect region $146\gamma$. Based on this premise, it can be easily determined that each interconnect region $146\beta$ includes which of the first to fourth interconnects L1 to L4.

Similarly to the interconnect group M4, all interconnects L can extend along the D1 axis in more than half of all interconnect layers ML in the interconnect croup M5. When the NAND type flash memory 1 includes only three interconnect layers: the first interconnect layer ML1; the second interconnect layer ML2; and the third interconnect layer ML3 in total, all interconnects L extend along the D1 axis in all of the first to third interconnect layers ML1 to ML3 in the interconnect group M5. As a generalized characteristic, when the NAND type flash memory 1 includes n interconnect layers ML, all interconnects L in m ($n/2+1 < m \leq n$ and $3 \leq n$) interconnect layers ML can extend along the D1 axis. In particular, when n is an odd number, all interconnects L in m interconnect layers ML can extend along the D1 axis.

The interconnects L in the interconnect region 146-2 are not directly coupled to the interconnects L in the control circuit 141, and only couple the interconnects L in the interconnect region 146-1 to the interconnects L in the interconnect region 146-3.

The interconnect region 146-3 includes an interconnect croup M6. The interconnect group M6 is made of any one or more of interconnects L of the first interconnects L1, the second interconnects L2, the third interconnects L3, and the fourth interconnects L4. Each interconnect L of the interconnect group M6 includes a section extending along the D1 axis and a section extending along the D2 axis. In each interconnect L of the interconnect group M6, the section extending along the D1 axis and the section extending along the D2 axis are coupled to each other. One first interconnect L1, one second interconnect L2, one third interconnect L3, and one fourth interconnect L4 of the interconnect group M6 may be coupled to one first interconnect L1, one second interconnect L2, one third interconnect L3, and one fourth interconnect L4 of the interconnect group M5, respectively.

The interconnects L in the interconnect region 146-3 are not directly coupled to the interconnects L in the control circuit 141, and only couple the interconnects L in the interconnect region 146-2 to the interconnects L in the interconnect region 146-5.

The interconnect region 146-5 includes an interconnect group M8. The interconnect group M8 is made of any one or more of interconnects L of the first interconnects L1, the second interconnects L2, the third interconnects L3, and the fourth interconnects L4. One first interconnect L1, one second interconnect L2, one third interconnect L3, and one fourth interconnect L4 of the interconnect group M8 may be coupled to one first interconnect L1, one second interconnect L2, one third interconnect L3, and one fourth interconnect L4 of the interconnect group M6, respectively.

The interconnect region 146-5 shares an interconnect group M2 with the control circuit 141. That is, a section (e.g., one end) of each interconnect L of the interconnect croup M2 is located inside the control circuit 141, and another section (e.g., the other end) thereof is located inside the interconnect region 146-5. The interconnect croup M2 extends along the D1 axis and is made of any one or more of interconnects L of the first interconnects L1, the second interconnects L2, the third interconnects L3, and the fourth interconnects L4. Each of some first interconnects L1, each of some second interconnects L2, each of some third interconnects L3, and each of some fourth interconnects L4 of the interconnect group M2 may be directly coupled to one first interconnect L1, one second interconnect L2, one third interconnect L3, and one fourth interconnect L4 of the interconnect group M8, respectively. The interconnect region 146-5 further includes contacts C. Each of the contacts C couples one interconnect L of the interconnect group M2 to one interconnect L of the interconnect group M8. Some interconnects L of the interconnect group M2 may be coupled to components in the control circuit 141 through the contacts C.

The interconnect region 146-7 includes an interconnect croup M10. The interconnect group M10 is made of any one or more of interconnects L of the first interconnects L1, the second interconnects L2, the third interconnects L3, and the fourth interconnects L4. One first interconnect L1, one second interconnect L2, one third interconnect L3, and one fourth interconnect L4 of the interconnect group M10 may be coupled to one first interconnect L1, one second interconnect L2, one third interconnect L3, and one fourth interconnect L4 of the interconnect group M8, respectively.

The interconnect region 146-7 shares an interconnect croup M11 with the column control circuit 142. That is, a section (e.g., one end) of each interconnect L of the interconnect group M11 is located inside the column control circuit 142, and another section (e.g., the other end) thereof is located inside the interconnect region 146-7. The interconnect group M11 extends along the D2 axis and is made of any one or more of interconnects L of the first interconnects L1, the second interconnects L2, the third interconnects L3, and the fourth interconnects L4. Each of some first interconnects L1, each of some second interconnects L2, each of some third interconnects L3, and each of some fourth interconnects L4 of the interconnect croup M11 may be directly coupled to one first interconnect L1, one second interconnect L2, one third interconnect L3, and one fourth interconnect L4 of the interconnect group M10, respectively. The interconnect region 146-7 further includes contacts C. Each of the contacts C couples one interconnect L of the interconnect group M11 to one interconnect L of the interconnect group M10. Some interconnects L of the interconnect group M11 may be coupled to components in the column control circuit 142 through the contacts C.

The interconnect region 146-7 shares an interconnect croup M12 with the pad region 144. That is, a section (e.g., one end) of each interconnect L of the interconnect group M12 is located inside the pad region 144, and another section (e.g., the other end) thereof is located inside the interconnect region 146-7. The interconnect group M12 extends along the D2 axis and is made of any one or more of interconnects L of the first interconnects L1, the second interconnects L2, the third interconnects L3, and the fourth interconnects L4. Each of some first interconnects L1, each of some second interconnects L2, each of some third interconnects L3, and each of some fourth interconnects L4 of the interconnect group M12 may be directly coupled to one first interconnect L1, one second interconnect L2, one third interconnect L3, and one fourth interconnect L4 of the interconnect group M10, respectively. The interconnect region 146-7 further includes contacts C. Each of the contacts C couples one interconnect L of the interconnect group H12 to one interconnect L of the interconnect group M10. Some interconnects L of the interconnect group M12 may be coupled to components in the pad region 144 through the contacts C.

The interconnect region 146-4 includes an interconnect croup M7. The interconnect group M7 is made of any one or more of interconnects L of the first interconnects L1, the second interconnects L2, the third interconnects L3, and the fourth interconnects L4. Each interconnect L of the interconnect group M7 includes a section extending along the D1 axis and a section extending along the D2 axis. In each interconnect L of the interconnect group M7, the section extending along the D1 axis and the section extending along the D2 axis are coupled to each other. One first interconnect L1, one second interconnect L2, one third interconnect L3, and one fourth interconnect L4 of the interconnect group M7 may be coupled to one first interconnect L1, one second interconnect L2, one third interconnect L3, and one fourth interconnect L4 of the interconnect group MA, respectively.

The interconnects L in the interconnect region 146-4 are not directly coupled to the interconnects L in the control circuit 141, and only couple the interconnects L in the interconnect region 146-1 to the interconnects L in the interconnect region 146-6.

The interconnect region 146-6 includes an interconnect croup M9. The interconnect group M9 is made of any one or more of interconnects L of the first interconnects L1, the second interconnects L2, the third interconnects L3, and the fourth interconnects L4. One first interconnect L1, one second interconnect L2, one third interconnect L3, and one fourth interconnect L4 of the interconnect group M9 may be coupled to one first interconnect L1, one second interconnect L2, one third interconnect L3, and one fourth interconnect L4 of the interconnect group M7, respectively.

The interconnect region 146-6 shares an interconnect croup M3 with the control circuit 141. That is, a section (e.g., one end) of each interconnect L of the interconnect group M3 is located inside the control circuit 141, and another section (e.g., the other end) thereof is located inside the interconnect region 146-6. The interconnect croup M3 extends along the D1 axis and is made of any one or more of interconnects L of the first interconnects L1, the second interconnects L2, the third interconnects L3, and the fourth interconnects L4, Each of some first interconnects L1, each of some second interconnects L2, each of some third interconnects L3, and each of some fourth interconnects L4 of the interconnect group M3 may be directly coupled to one first interconnect L1, one second interconnect L2, one third interconnect L3, and one fourth interconnect L4 of the interconnect group M9, respectively. The interconnect region 146-6 further includes contacts C. Each of the contacts C couples one interconnect L of the interconnect group M3 to one interconnect L of the interconnect group M9. Some interconnects L of the interconnect group M3 may be coupled to components in the control circuit 141 through the contacts C.

The interconnect region 146-3 includes an interconnect croup M13. The interconnect group M13 is made of any one or more of interconnects L of the first interconnects L1, the second interconnects L2, the third interconnects L3, and the fourth interconnects L4. One first interconnect L1, one second interconnect L2, one third interconnect L3, and one fourth interconnect L4 of the interconnect group M13 may be coupled to one first interconnect L1, one second interconnect L2, one third interconnect L3, and one fourth interconnect L4 of the interconnect group M9, respectively.

The interconnect region 146-8 shares an interconnect croup M14 with the driver 143. That is, a section (e.g., one end) of each interconnect L of the interconnect group M14 is located inside the driver 143, and another section (e.g., the other end) thereof is located inside the interconnect region 146-8. The interconnect group M14 extends along the D2 axis and is made of any one or more of interconnects L of the first interconnects L1, the second interconnects L2, the third interconnects L3, and the fourth interconnects L4. Each of some first interconnects L1, each of some second interconnects L2, each of some third interconnects L3, and each of some fourth interconnects L4 of the interconnect group M14 may be directly coupled to one first interconnect L1, one second interconnect L2, one third interconnect L3, and one fourth interconnect L4 of the interconnect group M13, respectively. The interconnect region 146-8 further includes contacts C. Each of the contacts C couples one interconnect L of the interconnect group M14 to one interconnect L of the interconnect group M13. Some interconnects L of the interconnect group M14 may be coupled to components in the driver 143 through the contacts C.

The interconnect region 146-8 shares an interconnect croup M15 with the pad region 145. That is, a section (e.g., one end) of each interconnect L of the interconnect croup M15 is located inside the pad region 145, and another section (e.g., the other end) thereof is located inside the interconnect region 146-8. The interconnect group M15 extends along the D2 axis and is made of any one or more of interconnects L of the first interconnects L1, the second interconnects L2, the third interconnects L3, and the fourth interconnects L4. Each of some first interconnects L1, each of some second interconnects L2, each of some third interconnects L3, and each of some fourth interconnects L4 of the interconnect group M15 may be directly coupled to one first interconnect L1, one second interconnect L2, one third interconnect L3, and one fourth interconnect L4 of the interconnect group M13, respectively. The interconnect region 146-8 further includes contacts C. Each of the contacts C couples one interconnect L of the interconnect group M15 to one interconnect L of the interconnect group M13. Some interconnects L of the interconnect group M15 may be coupled to components in the pad region 145 through the contacts C.

<1-1-3> Configuration of Control Circuit

Figure 5:
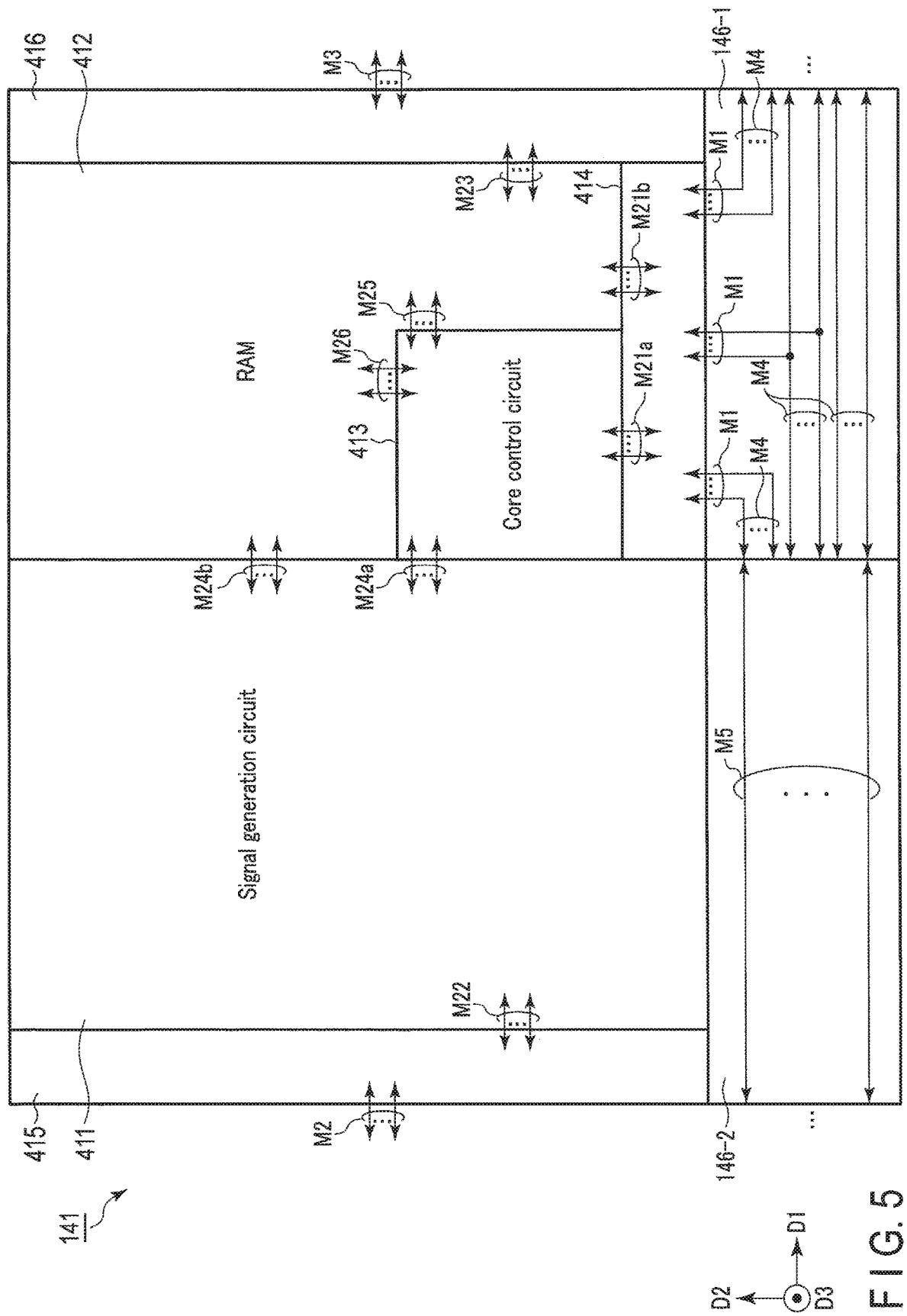
FIG. 5 illustrates a planar structure of a part of a control circuit of the semiconductor memory device according to the first embodiment.

The configuration of the control circuit 141 will now be described with reference to FIG. 5. FIG. 5 illustrates a part of the control circuit 141 of the first embodiment and the surroundings thereof along the D1 axis and the D2 axis and further illustrates interconnect groups M for electrically coupling components to each other. FIG. 5 further schematically illustrates the coupling between the interconnect group M4 and the interconnect group M1 in the interconnect region 146-1.

As illustrated in FIG. 5, the control circuit 141 includes a signal generation circuit 411, a random access memory (RAM) 412, a core control circuit 413, a lower end input and output circuit 414, a left end input and output circuit 415, and a right end input and output circuit 416.

The left end input and output circuit 415 is located on the left end of the control circuit 141 and extends along the D2 axis. The left end input and output circuit 415 includes output buffers and input buffers, and outputs and receives signals. The left end input and output circuit 415 outputs and receives, for example, a high-speed signal such as a signal from the pad region 144.

The right end input and output circuit 416 is located on the right end of the control circuit 141 and extends along the D2 axis. The right end input and output circuit 416 includes output buffers and input buffers, and outputs and receives signals. The right end input and output circuit 416 outputs and receives, for example, a high-speed signal such as a signal from the pad region 145.

The signal generation circuit 411 is located on the right side of the left end input and output circuit 415 and located on the lower end of the control circuit 141. The signal generation circuit 411 generates control signals for controlling the NAND type flash memory 1. The signal generation circuit 411 includes transistors formed on the substrate Sub, interconnects L, and contacts C which couple the substrate Sub to the interconnects L or couples the interconnects L to each other.

The lower end input and output circuit 414 is located between the signal generation circuit 411 and the right end input and output circuit 416 on the lower end of the control circuit 141. The lower end input and output circuit 414 includes output buffers and input buffers, and outputs and receives signals. The lower end input and output circuit 414 outputs and receives, for example, a low-speed signal such as a control signal or a parameter signal.

The core control circuit 413 is located on the upper side of the lower end input and output circuit 414 and the right side of the signal generation circuit 411. The core control circuit 413 includes transistors formed on the substrate Sub, interconnects L, and contacts C which couple the substrate Sub to the interconnects L or couples the interconnects to each other.

The RAM 412 stores various parameters (e.g., a parameter relating to trimming) therein. The RAM 412 includes a section located between the signal generation circuit 411 and the right end input and output circuit 416 and a section located between the core control circuit 413 and the right end input and output circuit 416.

The signal generation circuit 411, the RAM 412, the core control circuit 413, the lower end input and output circuit 414, the left end input and output circuit 415, and the right end input and output circuit 416 include interconnects described below, and two of them in some pairs of the signal generation circuit 411, the RAM 412, the core control circuit 413, the lower end input and output circuit 414, the left end input and output circuit 415, and the right end input and output circuit 416 are electrically coupled to each other through interconnects described below.

The lower end input and output circuit 414 shares an interconnect group M21a with the core control circuit 413. That is, a section (e.g., one end) of each interconnect L of the interconnect group M21a is located inside the core control circuit 413, and another section (e.g., the other end) thereof is located inside the lower end input and output circuit 414. Further, the lower end input and output circuit 414 shares an interconnect group M21b with the RAM 412. That is, a section (e.g., one end) of each interconnect L of the interconnect group M21b is located inside the RAM 412, and another section (e.g., the other end) thereof is located inside the lower end input and output circuit 414. The interconnect groups M21a and M21b extend along the D2 axis. Each of the interconnect groups M21a and M21b includes any one or more of interconnects L of the first interconnects L1, the second interconnects L2, the third interconnects L3, and the fourth interconnects L4. Some interconnects L of the interconnect group M21a may be electrically coupled to components in the core control circuit 413 and components in the lower end input and output circuit 414 through contacts C. Some interconnects L of the interconnect group M21b may be electrically coupled to components in the RAM 412 and components in the lower end input and output circuit 414 through contacts C.

One end of each interconnect L of the interconnect croup M2 is located inside the left end input and output circuit 415. The left end input and output circuit 415 shares an interconnect group M22 with the signal generation circuit 411. That is, a section (e.g., one end) of each interconnect L of the interconnect group M22 is located inside the signal generation circuit 411, and another section (e.g., another end) thereof is located inside the left end input and output circuit 415. The interconnect croup M22 extends along the D1 axis and is made of any one or more of interconnects L of the first interconnects L1, the second interconnects L2, the third interconnects L3, and the fourth interconnects L4. Some interconnects L of the interconnect group M22 may be electrically coupled to components in the signal generation circuit 411 and components in the left end input and output circuit 415 through contacts C.

One end of each interconnect L of the interconnect croup M3 is located inside the right end input and output circuit 416. The right end input and output circuit 416 shares an interconnect group M23 with the RAM 412. That is, a section (e.g., one end) of each interconnect L of the interconnect group M23 is located inside the RAM 412, and another section (e.g., the other end) thereof is located inside the right end input and output circuit 416. The interconnect group M23 extends along the D1 axis and is made of any one or more of interconnects L of the first interconnects L1, the second interconnects L2, the third interconnects L3, and the fourth interconnects L4. Some interconnects L of the interconnect group M23 may be electrically coupled to components in the RAM 412 and components in the right end input and output circuit 416 through contacts C.

The signal generation circuit 411 and the core control circuit 413 share an interconnect group M24a. That is, one section (e.g., one end) of each interconnect L of the interconnect group M24a is located inside the signal generation circuit 411, and another section (e.g., the other end) thereof is located inside the core control circuit 413. The interconnect group M24a extends along the D1 axis and is made of any one or more of interconnects L of the first interconnects L1, the second interconnects L2, the third interconnects L3, and the fourth interconnects L4. Some interconnects L of the interconnect group M24a may be electrically coupled to components in the signal generation circuit 411 and components in the core control circuit 413 through contacts C.

The signal generation circuit 411 and the RAM 412 share an interconnect group M24b. That is, one section (e.g., one end) of each interconnect L of the interconnect croup M24b is located inside the signal generation circuit 411, and another section (e.g., the other end) thereof is located inside the RAM 412. The interconnect group M24b extends along the D1 axis and is made of any one or more of interconnects L of the first interconnects L1, the second interconnects L2, the third interconnects L3, the fourth interconnects L4. Some interconnects L of the interconnect croup M24b may be electrically coupled to components in the signal generation circuit 411 and components in the RAM 412 through contacts C.

The core control circuit 413 and the RAM 412 share an interconnect group M25. That is, a section (e.g., one end) of each interconnect L of the interconnect group M25 is located inside the core control circuit 413, and another section (e.g., the other end) thereof is located inside the RAM 412. The interconnect group M25 extends along the D1 axis and is made of any one or more of interconnects L of the first interconnects L1, the second interconnects L2, the third interconnects L3, and the fourth interconnects L4. Some interconnects L of the interconnect group M25 may be electrically coupled to components in the core control circuit 413 and components in the RAM 412 through contacts C.

The core control circuit 413 and the RAM 412 further share an interconnect group M26. That is, a section (e.g., one end) of each interconnect L of the interconnect group M26 is located inside the core control circuit 413, and another section (e.g., the other end) thereof is located inside the RAM 412. The interconnect group M26 extends along the D2 axis and is made of any one or more of interconnects L of the first interconnects L1, the second interconnects L2, the third interconnects L3, and the fourth interconnects L4. Some interconnects L of the interconnect group M26 may be electrically coupled to components in the core control circuit 413 and components in the RAM 412 through contacts C.

One end of each interconnect L of the interconnect croup M1 is located inside the lower end input and output circuit 414. As described above, the other end of each interconnect L of the interconnect group M1 is coupled to one interconnect L of the interconnect group M4 directly or through the contact C. As a specific example, each of some first interconnects L1 of the interconnect group M1 may be coupled to one first interconnect L1 of the interconnect croup M4 to form a bent (L-shaped) interconnect L. Similarly, each of some second interconnects L2, each of some third interconnects L3, and each of some fourth interconnects L4 of the interconnect group M1 may be respectively coupled to one second interconnect L2, one third interconnect L3, and one fourth interconnect L4 of the interconnect group M4 to form bent interconnects L. Alternatively, each of some first interconnects L1 of the interconnect group M1 may be coupled to one first interconnect L1 of the interconnect group M4 to form a T-shaped interconnect L. Similarly, each of some second interconnects L2, each of some third interconnects L3, and each of some fourth interconnects L4 of the interconnect croup M1 may be respectively coupled to one second interconnect L2, one third interconnect L3, and one fourth interconnect L4 of the interconnect group M4 to form T-shaped interconnects L.

The interconnect group M4 includes interconnects that are connected to none of the interconnects L of the interconnect group M1 as well as the interconnects L that are connected to one of the interconnects of the interconnect group M1. That is, the interconnect group M4 includes some interconnects L (e.g., the interconnects on the lower end of the interconnect group M4 in FIG. 5) that extend over along the D1 axis to two sides (the left side and the right side) of the interconnect region 146-1, the two sides being opposed to each other with respect to the D1 axis.

As described above, all first interconnects L1, all second interconnects L2, all third interconnects L3, and all fourth interconnects L4 of the interconnect group M5 extend along the D1 axis. A certain interconnect L of the interconnect group M5 is coupled to the interconnect L of the interconnect group M4 extending over along the D1 axis to the two sides of the interconnect region 146-1 which are opposed to each other with respect to the D1 axis to form an interconnect L extending over along the D1 axis to extension lines of two sides (the left side and the right side) of the control circuit 141, the two sides being opposed to each other with respect to the D1 axis.

Figure 6:
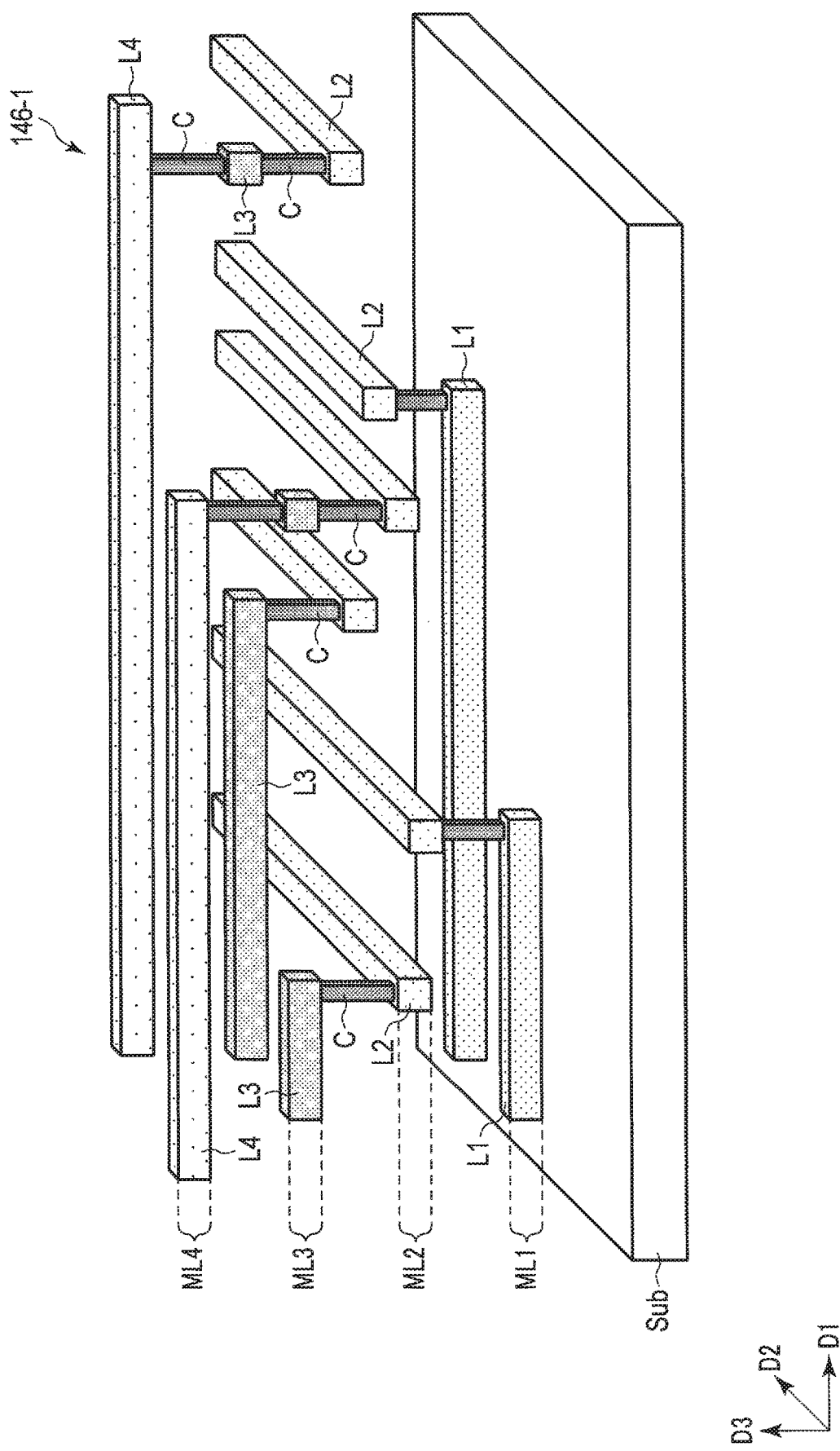
FIG. 6 is a perspective view of an example of the structure of a part of an interconnect region of the first embodiment.
Figure 7:
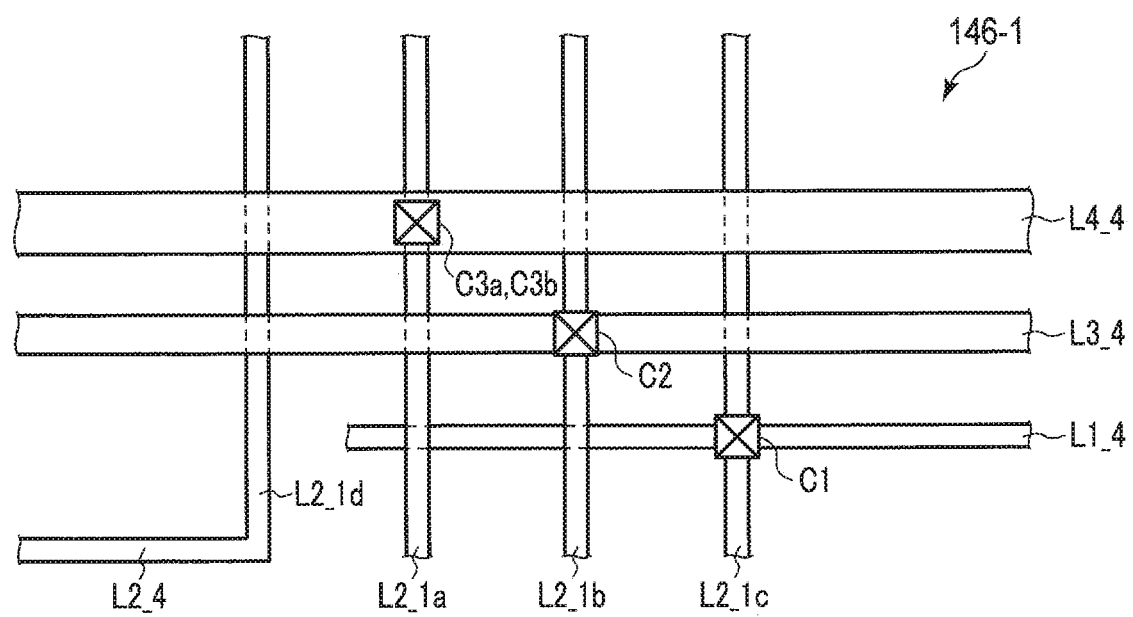
FIG. 7 illustrates a planar structure of a part of the interconnect region.
Figure 8:
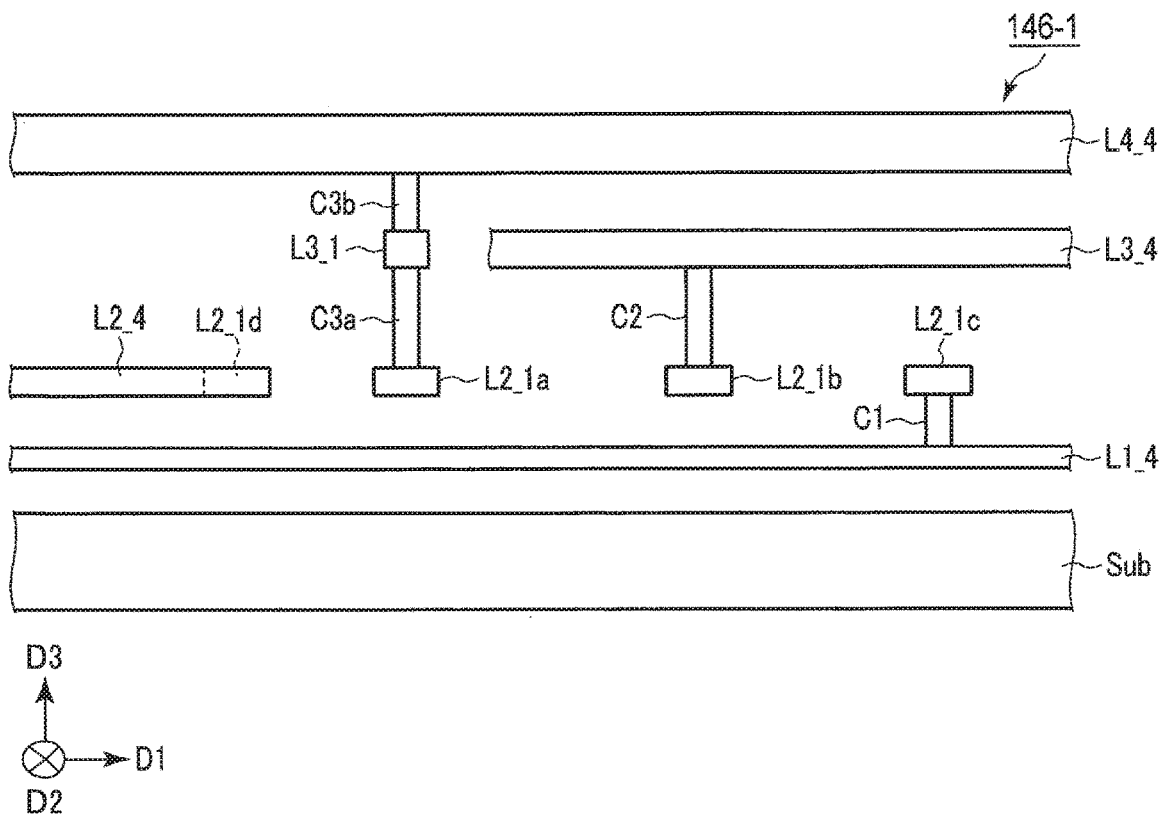
FIG. 8 illustrates a cross-sectional structure of a part of the interconnect region.

The structure of the interconnect region 146-1 will now be described with reference to FIGS. 6 to 8. FIG. 6 is a perspective view of an example of the structure of a part of the interconnect region 146-1. FIG. 7 illustrates another example of the structure of a plane along a D1 and D2 plane in a part of the interconnect region 146-1. FIG. 8 illustrates an example of a cross-sectional structure of a part of the interconnect region 146-1 and corresponds to FIG. 7.

As described above, each of the interconnect groups M4 and M1 is made of any one or more of interconnects L of the first interconnects L1, the second interconnects L2, the third interconnects L3, and the fourth interconnects L4. Each of some first interconnects L1, each of some second interconnects L2, each of some third interconnects L3, and each of some fourth interconnects L4 of the interconnect croup M1 may be directly coupled to one first interconnect L1, one second interconnect L2, one third interconnect L3, and one fourth interconnect L4 of the interconnect group M4, respectively, or may be coupled to one interconnect L of the interconnect group M4 through the contact C. FIGS. 6 to 8 illustrate examples of the structure for such coupling.

As illustrated in FIG. 6, except for the second interconnect layer ML2, all of the first interconnects L1 in the first interconnect layer ML1, all of the third interconnects L3 in the third interconnect layer ML3, and all of the fourth interconnects L4 in the fourth interconnect layer ML4 extend along the D1 axis. On the other hand, at least some of the second interconnects L2 in the second interconnect layer ML2 extend along an axis that differs from the D1 axis, for example, along the D2 axis. One of the second interconnects L2 is coupled to one of the first interconnects L1 through a contact C, and another one of the second interconnects L2 is coupled to one of the third interconnects L3 through a contact C. Further, one of the second interconnects L2 is coupled to the fourth interconnect L4 through one of the third interconnects L3 and a contact C. As can be understood from FIG. 6, the third interconnects L3 also include those that do not extend along the D1 axis in the strict sense and couple a contact C connected to a second interconnect L2 to a contact C connected to a fourth interconnect L4.

FIGS. 7 and 8 illustrate interconnects L1_4, L2_4, L3_4, and L4_4 as examples of the first interconnects L1, the second interconnect L2, the third interconnect L3, and the fourth interconnect L4 of the interconnect group M4, respectively, and illustrate interconnects L2_1a, L2_1b, L2_1c, and L2_1d as examples of the second interconnects L2 of the interconnect group M1.

The interconnects L2_1a, L2_1b, L2_1c, and L2_1d are located in the second interconnect layer ML2 and extend along the D2 axis. The interconnects L1_4, L2_4, L3_4, and L4_4 are located in the first interconnect layer ML1, the second interconnect layer ML2, the third interconnect layer ML3, and the fourth interconnect layer ML4, respectively, and extend along the D1 axis. The interconnect L2_1c is coupled to the interconnect L1_4 through a contact C1. The interconnect L2_1b is coupled to the interconnect L3_4 through a contact C2. The interconnect L2_1a is coupled to the interconnect L4_4 through a contact C3a, an interconnect L3_1, and a contact C3b. The interconnect L2_1d is coupled to the interconnect L2_4 to form an interconnect having a pattern bent along the D1 and D2 plane.

The interconnect regions 146-7 and 146-8 also have the structure illustrated in FIGS. 6 and 7 similarly to the interconnect region 146-1. That is, the description for a set of the interconnect region 146-1 and the interconnect croups M4 and M1 which has been made above with reference to FIGS. 6 to 8 applies to a set of the interconnect region 146-7 and the interconnect groups M10 and M11, a set of the interconnect region 146-7 and the interconnect groups M10 and M12, a set of the interconnect region 146-8 and the interconnect groups M13 and M14, and a set of the interconnect region 146-8 and the interconnect groups M13 and M15. In this case, the description for the interconnect croup M1 applies to the interconnect groups M11, M12, M14, and M15. Further, the description for the interconnect croup M4 applies to the interconnect groups M10 and M13.

The interconnect regions 146-5 and 146-6 also have a structure similar to the structure of the interconnect region 146-1. However, the directions of the first to fourth interconnects L1 to L4 in the interconnect regions 146-5 and 146-6 differ from those in the interconnect region 146-1, specifically, as follows. That is, the description for the set of the interconnect region 146-1 and the interconnect groups M4 and M1 which has been made above with reference to FIGS. 6 to 8 applies to a set of the interconnect region 146-5 and the interconnect groups M8 and M2 and a set of the interconnect region 146-6 and the interconnect groups M9 and M3 by replacing "D1 axis" with "D2 axis" and replacing "D2 axis" with "D1 axis". In this case, the description for the interconnect group M1 applies to the interconnect groups M2 and M3, and the description for the interconnect group M4 applies to the interconnect groups M8 and M9.

Figure 9:
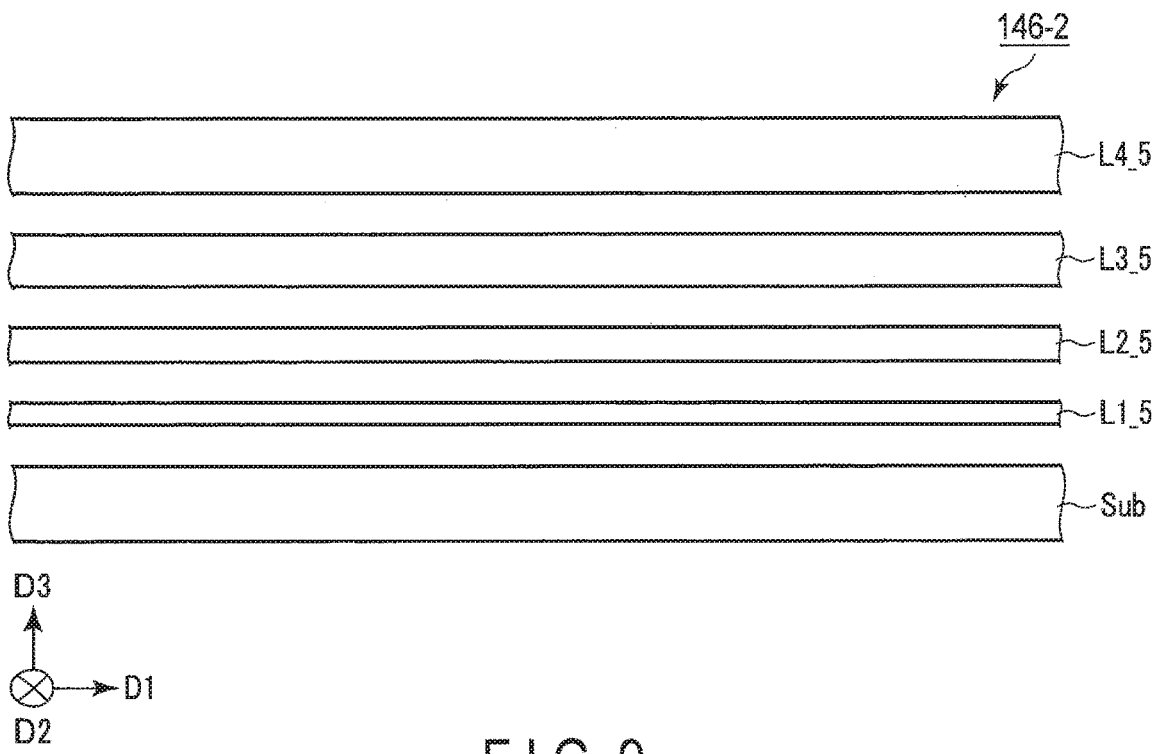
FIG. 9 illustrates a planar structure of a part of the interconnect region.

The structure of the interconnect region 146-2 will now be described with reference to FIG. 9. FIG. 9 illustrates a cross-sectional structure of a part of the interconnect region 146-2. FIG. 9 illustrates an example in which the interconnect group M5 includes a first interconnect L1_5, a second interconnect L2_5, a third interconnect L3_5, and a fourth interconnect L4_5 as examples of the first to fourth interconnects L1 to L4, respectively. As described above and illustrated in FIG. 9, all of the interconnects L of the interconnect group M5 extend along the D1 axis as an example.

The interconnect regions 146-3 and 146-4 also have a structure similar to the structure of the interconnect region 146-2. However, the shapes (planar shapes) along an xy plane of the first to fourth interconnects L1 to L4 in the interconnect regions 146-3 and 146-4 differ from those in the interconnect region 146-2. Specifically, the description for the interconnect group M5 which has been made above with reference to FIG. 9 generally applies to the interconnect regions 146-3 and 146-4. In this case, the description for the interconnect group M5 applies to the interconnect groups M6 and M7. However, at least some interconnects L of the interconnect groups M6 and M7 are bent like the shape of the interconnect L formed by the interconnects L2_1d and L2_4 of FIG. 7.

<1-2> Advantages

The NAND type flash memory 1 of the embodiment includes the interconnect regions 146-1, 146-2, 146-3, and 146-4 on the end thereof. Thus, the NAND type flash memory 1 can be made smaller in size as described below.

First, in order to describe advantages of the embodiment, a comparative example will be described with reference to FIGS. 10 and 11.

Figure 10:
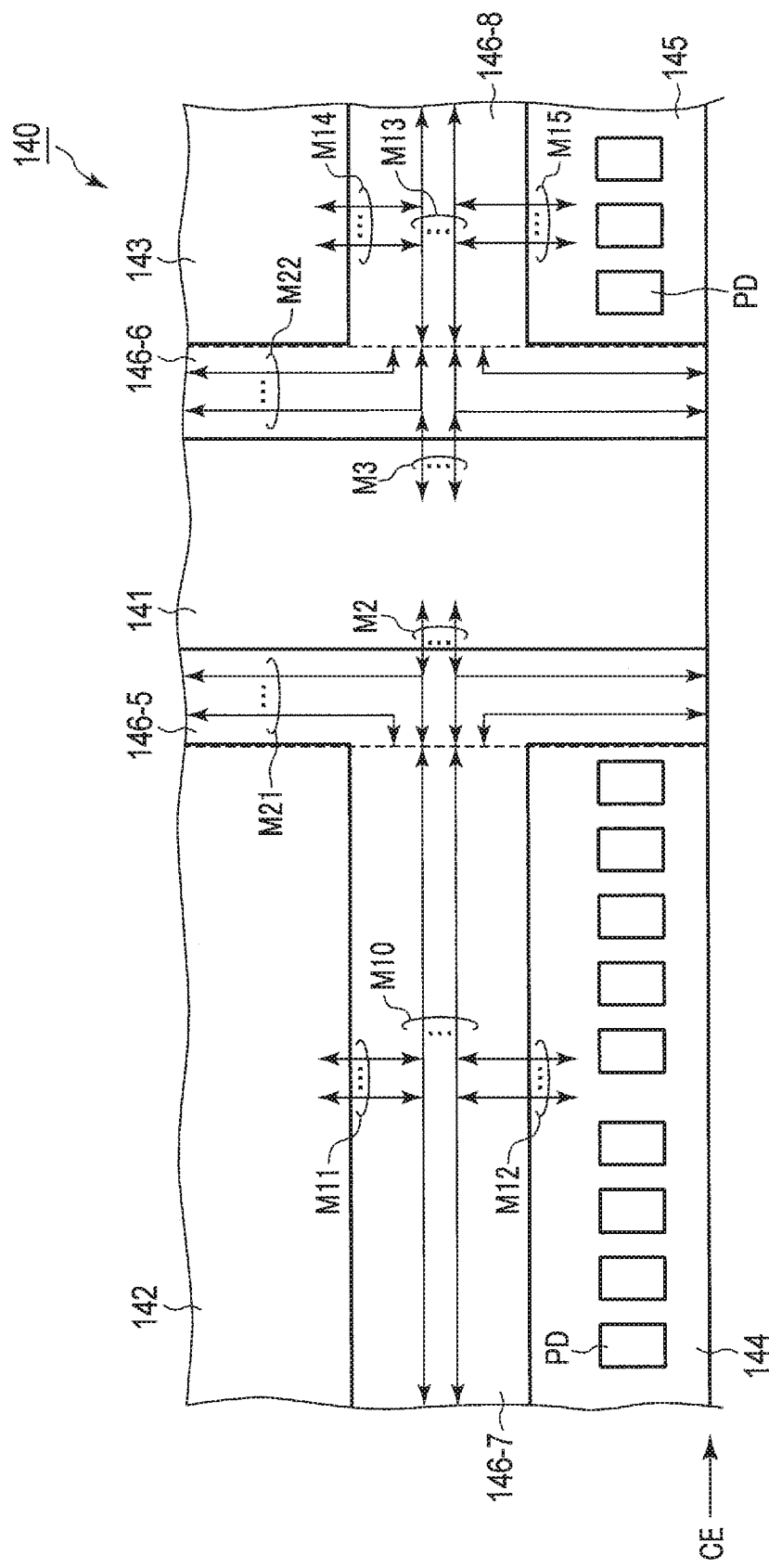
FIG. 10 illustrates a planar structure of a part of a peripheral circuit of a semiconductor memory device according to a comparative example.

As illustrated in FIG. 10, a peripheral circuit 140 according to the comparative example is not provided with the interconnect regions 146-1, 146-2, 146-3, and 146-4 described in the first embodiment. Further, a control circuit 141 according to the comparative example is disposed on the edge of a NAND type flash memory 1. Thus, a route of the transmission of signals to the control circuit 141 according to or from the comparative example is limited to routes of interconnect groups M2 and M3, which extend across the left end and the right end of the control circuit 141, respectively. The details thereof are illustrated in FIG. 11.

Figure 11:
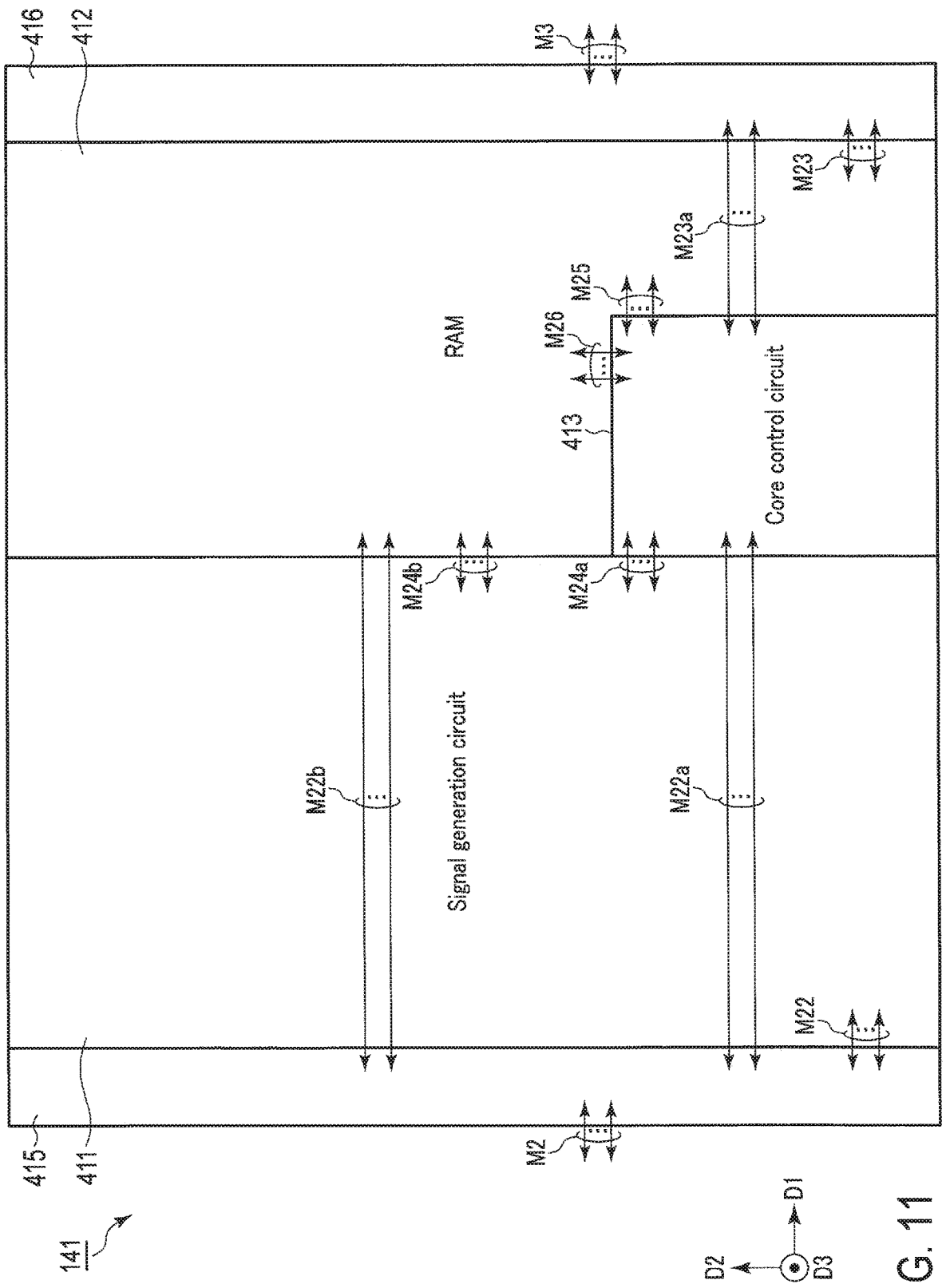
FIG. 11 illustrates a planar structure of a part of a control circuit of the semiconductor memory device according to the comparative example.

As illustrated in FIG. 11, the control circuit 141 according to the comparative example is not provided with the lower end input and output circuit 414 described in the first embodiment. Thus, the transmission and reception of signals, which is performed through the lower end input and output circuit 414 in the first embodiment, needs to be performed through a left end input and output circuit 415 and a right end input and output circuit 416. Thus, an interconnect group M22a is disposed on the signal generation circuit 411 for coupling the core control circuit 413 and the left end input and output circuit 415 to each other. Similarly, an interconnect group M23a is disposed over the RAM 412 for coupling the core control circuit 413 and the right end input and output circuit 416 to each other. Interconnects such as an interconnect group M22b which extends across the signal generation circuit 411 may be provided for coupling the RAM 412 and the left end input and output circuit 415 to each other based on the necessity of the transmission and reception of signals, which would be performed through the lower end input and output circuit 414, through the left end input and output circuit 415 and the right end input and output circuit 416. As a result, too many interconnects may be disposed in the comparative example, in particular in the signal generation circuit 411. The signal generation circuit 411 is already crowded with interconnects. Thus, the size of the signal generation circuit 411 needs to be increased for disposing the interconnect groups M22*a* and M22*b*. This results in a restriction on a reduction in the size of the signal generation circuit 411 due to a bottleneck caused by the disposition of the interconnect groups M22*a* and M22*b*.

In the first embodiment, the control circuit 141 is provided with the lower end input and output circuit 414, and the interconnect regions 146-1, 146-2, 146-3, and 146-4 are disposed on the lower end of the NAND type flash memory 1. Thus, part of the transmission and reception of signals, which is performed through the left end input and output circuit 415 and the right end input and output circuit 416 in the comparative example, can be performed through the lower end input and output circuit 414. As a result, the interconnect groups M22*a* and M23*a* in the comparative example are not necessary in the first embodiment. Thus, in the first embodiment, the number of interconnects that need to be disposed over the signal generation circuit 411, which is most crowded with interconnects, is smaller than that in the comparative example. As a result, the restriction on the reduction in the size of the peripheral circuit 140 in the first embodiment is smaller than the restriction in the comparative example. Thus, the size of the control circuit 141 of the first embodiment can be smaller than the size of the control circuit 141 of the comparative example. As a result, it is possible to provide the NAND type flash memory 1 that can be made smaller.

In particular, using more interconnect layers in the interconnect regions 146-1 and 146-2 increases the advantages brought by providing the interconnect regions 146-1 and 146-2 as described below. That is, as generally applied and applied to the above comparative example, for example, due to the ease of manufacture, in a large number of regions in a NAND type flash memory, more specifically, substantially all regions including interconnects (interconnect containing regions), each interconnect layer includes only interconnects along one axis, and, in two adjacent interconnect layers, the direction of the interconnects in one of the interconnect layers differs from the direction of the interconnects in the other interconnect layer. On the other hand, the interconnect regions 146-1 and 146-2 of the embodiment are intended to lead interconnects that enter the interconnect regions 146-1 and 146-2 from another region along the D1 axis. Based on this, in the interconnect regions 146-1 and 146-2, interconnects L along the D1 axis can be disposed even in an interconnect layer including interconnects L extending along the D2 axis in another region, or a D2-axis interconnect layer. Accordingly, more interconnects L can extend along the D1 axis in the interconnect regions 146-1 and 146-2 than in the case where the interconnects L along the D2 axis are disposed in the D2-axis interconnect layer. When more D2-axis interconnect layers in the interconnect regions 146-1 and 146-2 are used for disposing interconnects L along the D1 axis, more interconnects L along the D1 axis can be provided in the interconnect regions 146-1 and 146-2.

Typically, when a HAND type flash memory includes an even number of interconnect layers, the number p of interconnect layers that include interconnects extending along the D1 axis (D1-axis interconnect layers) is equal to the number q of D2-axis interconnect layers (p=q), and when a NAND type flash memory includes an odd number of interconnect layers, the number p is q±1. Thus, in the interconnect region 146-1 and/or the interconnect region 146-2, all interconnects L in m (n/2<m≤n) interconnect layers can extend along the D1 axis, and when n is an odd number, all interconnect L in m (n/2+1<m≤n) interconnect layers can extend along the D1 axis. This increases the advantages brought by providing the interconnect regions 146-1 and 146-2. Further, when the interconnect region 146-1 and/or the interconnect region 146-2 includes only the D1-axis interconnect layers, the advantages brought by providing the interconnect regions 146-1 and 146-2 are maximum.

Note that a circuit that can be disposed in sections corresponding to the interconnect regions 146-1, 146-2, 146-3, and 146-4 in the comparative example cannot be disposed in the interconnect regions 146-1, 146-2, 146-3, and 146-4 in the embodiment. However, stabilizing capacitors can be disposed. The disposed stabilizing capacitors can be utilized as stabilizing capacitors for a power supply of the control circuit 141 itself.

<1-3> Modifications

FIG. 12 illustrates a part of a peripheral circuit 140 of a first modification of the first embodiment, particularly, the surroundings of the control circuit 141 along the D1 axis and the D2 axis, and further illustrates interconnects for electrically coupling components to each other. As illustrated in FIG. 12, the interconnect region 146-2 of FIG. 3 is not provided. Instead, an interconnect region 146-1 is located between the interconnect region 146-3 and the interconnect region 146-4.

Figure 13:
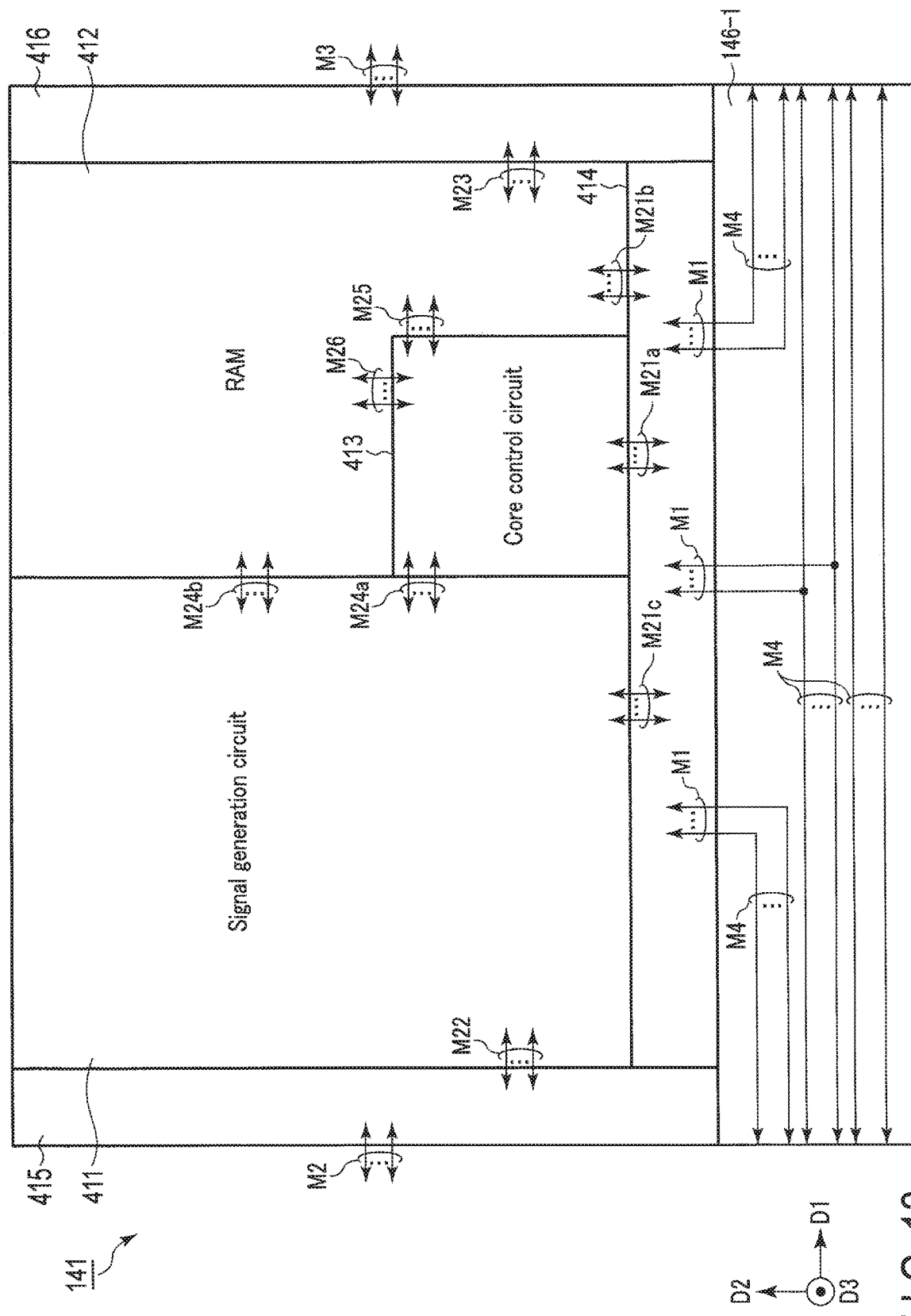
FIG. 13 illustrates a planar structure of a part of a control circuit of the semiconductor memory device according to the first modification of the first embodiment.

FIG. 13 illustrates a part of the control circuit 141 of the first modification of the first embodiment and the surroundings thereof along the D1 axis and the D2 axis, and further illustrates interconnects for electrically coupling components to each other. As illustrated in FIG. 13, the lower end input and output circuit 414 is located on the lower side of the signal generation circuit 411, the RAM 412, and the core control circuit 413, and extends over between the left end input and output circuit 415 and the right end input and output circuit 416. Based on such a layout, the interconnect group M1 is located not only below the RAM 412 and the core control circuit 413, but also below the signal generation circuit 411. The lower end input and output circuit 414 shares an interconnect group M21*c* with the signal generation circuit 411. That is, a section (e.g., one end) of each interconnect L of the interconnect group M21*c* is located inside the signal generation circuit 411, and another section (e.g., the other end) thereof is located inside the lower end input and output circuit 414. The interconnect group M21*c* extends along the D2 axis. The interconnect group M21*c* is made of any one or more of interconnects L of the first interconnects L1, the second interconnects L2, the third interconnects L3, and the fourth interconnects L4. Some interconnects L of the interconnect group M21*c* may be electrically coupled to components in the signal generation circuit 411 and components in the lower end input and output circuit 414 through contacts C.

Figure 14:
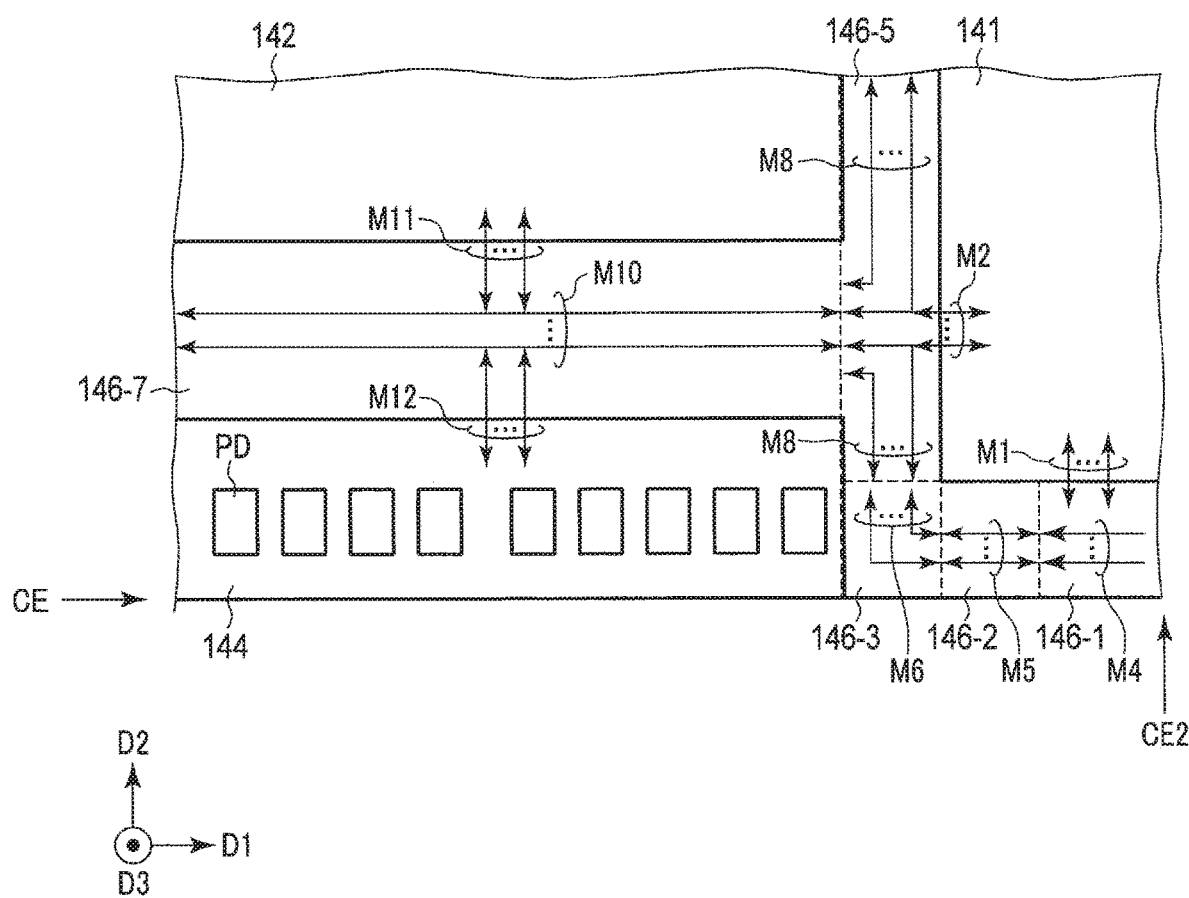
FIG. 14 illustrates a planar structure of a part of a peripheral circuit of a semiconductor memory device according to a second modification of the first embodiment.

FIG. 14 illustrates a part of a peripheral circuit 140 of a second modification of the first embodiment, particularly, the surroundings of the control circuit 141 along the D1 axis and the D2 axis, and further illustrates interconnects for electrically coupling components to each other. As illustrated in FIG. 14, the control circuit 141 and the interconnect region 146-2 are located on a right end CE2 of the NAKD type flash memory 1. Specifically, the interconnect region 146-2 is located on the lower end CE and the right end CE2 of the NAND type flash memory 1, that is, on the lower right corner of the NAND type flash memory 1. Further, the pad region 145, and the interconnect regions 146-4, 146-6, and 146-8 are not provided. The driver 143 is disposed at a position not illustrated in FIG. 14 or disposed at a position in a part of a column control circuit 142 of FIG. 14 instead of the part of the column control circuit 142.

Figure 15:
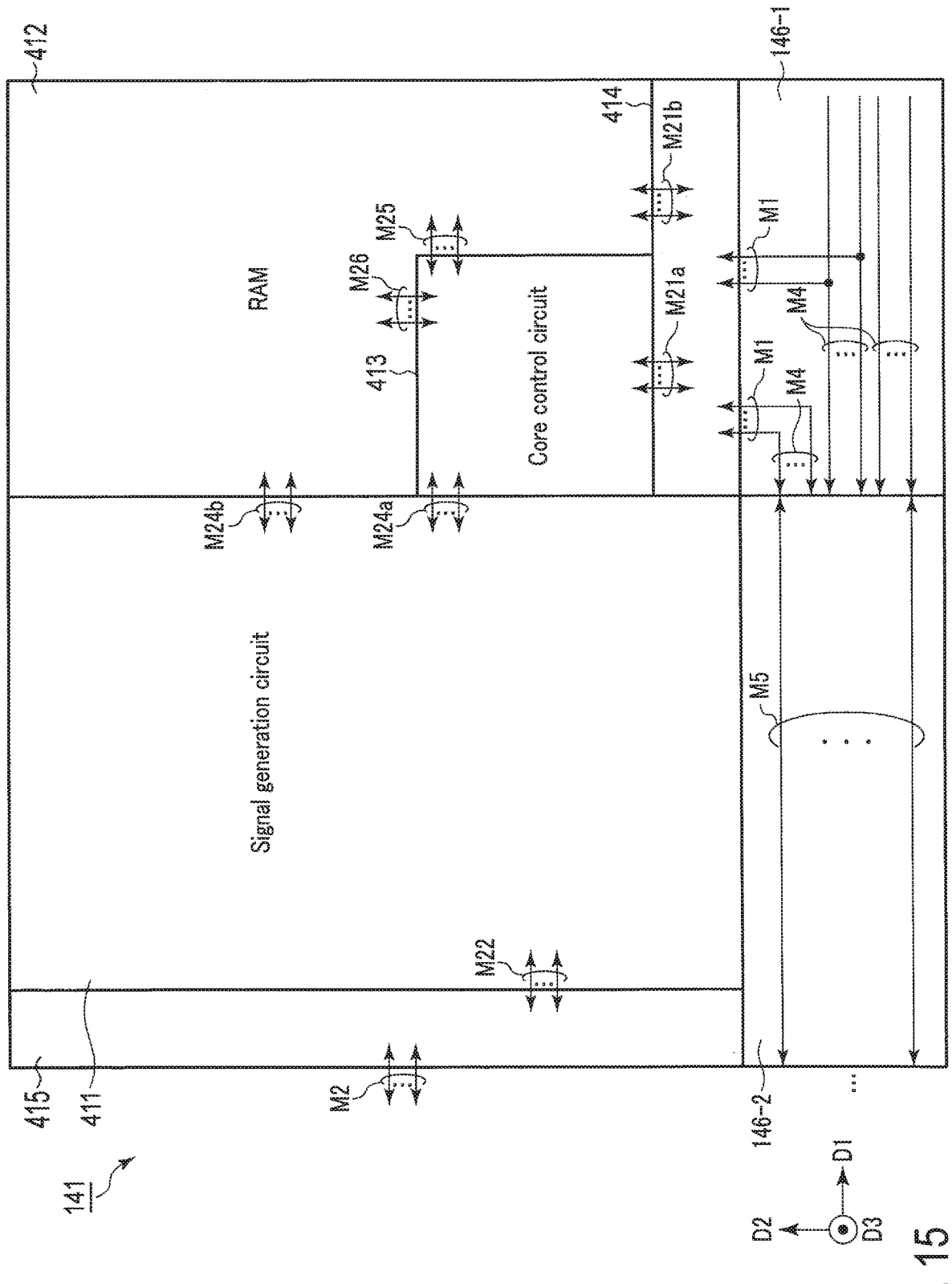
FIG. 15 illustrates a planar structure of a part of a control circuit of the semiconductor memory device according to the second modification of the first embodiment.

FIG. 15 illustrates a part of the control circuit 141 of the second modification of the first embodiment and the surroundings thereof along the D1 axis and the D2 axis, and further illustrates interconnects for electrically coupling components to each other. As illustrated in FIG. 15, the control circuit 141 and the interconnect region 146-1 are located on the end (right end CE2) of the NAND type flash memory 1. Thus, differently from the case illustrated in FIG. 3, the interconnect group M4 does not include interconnects L that reach the right end of the interconnect region 146-1, that is, reach the boundary with the interconnect region 146-4 in the case illustrated in FIG. 3.

<2> Second Embodiment

A second embodiment will be described. In the second embodiment, a control circuit 141 includes an additional port for inputting and outputting signals. Note that a basic configuration and a basic operation of a device according to the second embodiment are similar to those of the device according to the first embodiment described above. Thus, description for features that have been described in the first embodiment and features that can be easily analogized from the first embodiment will be omitted.

<2-1> Configuration

<2-1-1> Configuration of Peripheral Circuit

Figure 16:
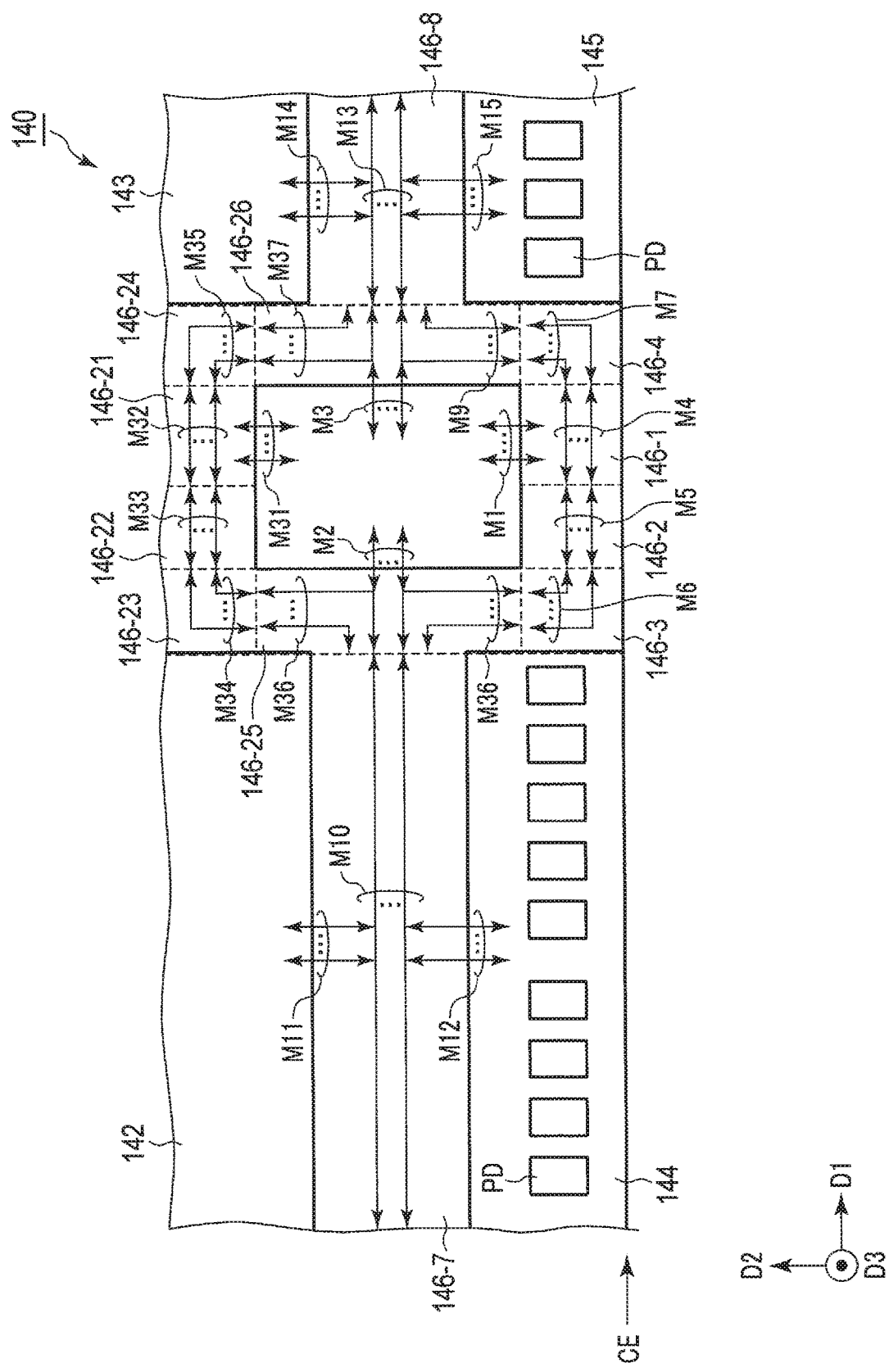
FIG. 16 illustrates a planar structure of a part of a peripheral circuit of a semiconductor memory device according to a second embodiment.

A peripheral circuit 140 will be described with reference to FIG. 16. FIG. 16 illustrates a part of the peripheral circuit 140 of the second embodiment, particularly, the surroundings of the control circuit 141 along the D1 axis and the D2 axis, and further illustrates interconnects for electrically coupling components to each other.

As illustrated in FIG. 16, the peripheral circuit 140 includes interconnect regions 146-25 and 146-26 instead of the interconnect regions 146-5 and 146-6 of the first embodiment (FIG. 3), respectively, and further includes interconnect regions 146-21 to 146-24.

The control circuit 141 is surrounded by a set of the interconnect regions 146-1 to 146-4 and 146-21 to 146-26, specifically, as follows. The interconnect regions 146-21, 146-22, 146-23, and 146-24 are located on the upper side of the control circuit 141. The interconnect regions 146-23, 146-22, 146-21, and 146-24 are adjacent to each other in this order from the left. The interconnect region 146-23 is surrounded by the column control circuit 142, and the interconnect regions 346-22 and 146-25. The interconnect regions 146-22 and 146-21 abut on the control circuit 141. The interconnect region 146-24 is surrounded by the driver 143, and the interconnect regions 146-21 and 146-26.

The interconnect region 146-25 is provided instead of the interconnect region 146-5, extends over between the interconnect regions 146-3 and 146-23, and abuts on an interconnect region 146-7. The interconnect region 146-26 is provided instead of the interconnect region 146-6, extends over between the interconnect regions 146-4 and 146-24, and abuts on an interconnect region 146-8.

The interconnect regions 146-21 to 146-24 include interconnects L described below, and two interconnect regions 146 in each of some pairs of the interconnect regions 146-1 to 146-4, 146-7, 146-8, and 146-21 to 146-26 are electrically coupled to each other through interconnects L described below.

The interconnect regions 146-21, 146-22, 146-23, and 146-24 are similar to the interconnect regions 146-1, 146-2, 146-3, and 146-4, respectively. That is, the interconnect regions 146-21 to 146-24 have characteristics similar to the characteristics of the interconnect regions 146-1 to 146-4, respectively, except the positional relationship with the control circuit 141, specifically, as follows. The interconnect region 146-21 includes an interconnect group M32 and shares an interconnect group M31 with the control circuit 141. The interconnect regions 146-22, 146-23, 146-24, 146-25, and 146-26 include interconnect croups M33, M34, M35, M36, and M37, respectively. The description in the first embodiment applies to description for the interconnect regions 146-21 to 146-26 and the interconnect groups M31 and M32 to M37 by replacing the interconnect regions 146-1 to 146-4 and the interconnect croups M1 and M4 to M9 with the interconnect regions 146-21 to 146-24 and the interconnect groups M31 and M32 to M37, respectively.

In addition, one first interconnect L1, one second interconnect L2, one third interconnect L3, and one fourth interconnect L4 of the interconnect group M36 may be coupled to one first interconnect L1, one second interconnect L2, one third interconnect L3, and one fourth interconnect L4 of the interconnect group M34, respectively. One first interconnect L1, one second interconnect L2, one third interconnect L3, and one fourth interconnect L4 of the interconnect group M37 may be coupled to one first interconnect L1, one second interconnect L2, one third interconnect L3, and one fourth interconnect L4 of the interconnect group M35, respectively.

<2-1-2> Configuration of Control Circuit

Figure 17:
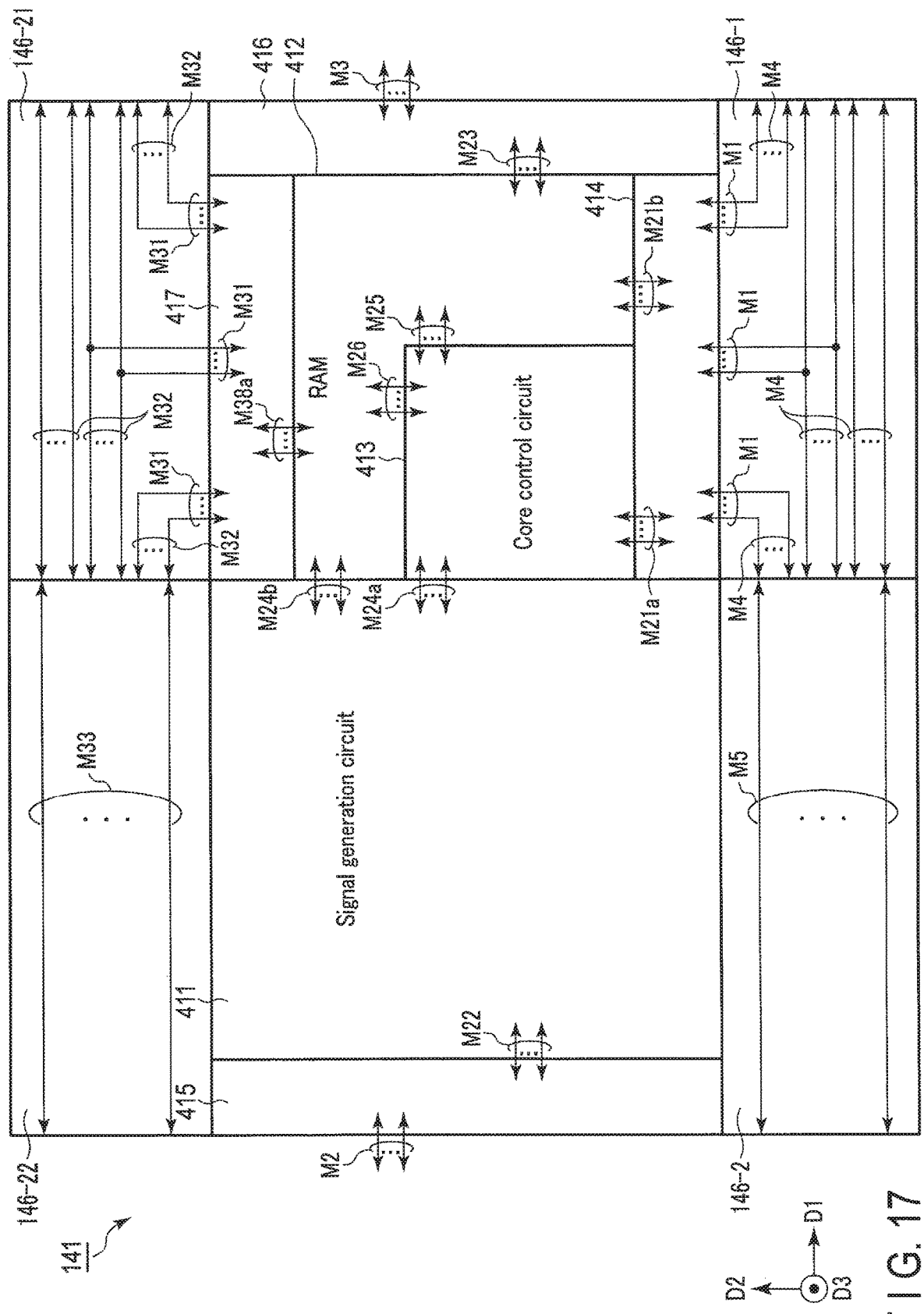
FIG. 17 illustrates a planar structure of a part of a control circuit of the semiconductor memory device according to the second embodiment.

The configuration of the control circuit 141 will now be described with reference to FIG. 17. FIG. 17 illustrates a part of the control circuit 141 of the second embodiment and the surroundings thereof along the D1 axis and the D2 axis, and further illustrates interconnects for electrically coupling components to each other. FIG. 17 further schematically illustrates coupling between the interconnect group M4 and the interconnect group M1 in the interconnect region 146-1 and coupling between the interconnect group M32 and the interconnect group M31 in the interconnect region 146-21.

As illustrated in FIG. 17, the control circuit 141 includes an upper end input and output circuit 417 as well as the components in the first embodiment (FIG. 5). The upper end input and output circuit 417 is located between a signal generation circuit 411 and a left end input and output circuit 415 on the upper side of the RAM 412, and extends along the D2 axis. The upper end input and output circuit 417 includes output buffers and input buffers, and outputs and receives signals. The upper end input and output circuit 417 outputs and receives, for example, a low-speed signal such as a control signal or a parameter signal.

The upper end input and output circuit 417 shares an interconnect group M38a with the RAM 412. That is, a section (e.g., one end) of each interconnect L of the interconnect group M38a is located inside the RAM 412, and another section (e.g., the other end) thereof is located inside the upper end input and output circuit 417. The interconnect group M38*a* extends along the D2 axis. The interconnect group M38*a* is made of any one or more of interconnects L of the first interconnects L1, the second interconnects L2, the third interconnects L3, and the fourth interconnects L4. Some interconnects L of the interconnect group M38*a* may be electrically coupled to components in the RAM 412 and components in the upper end input and output circuit 417 through contacts C. Further, a certain interconnect Lα in a certain layer MLα of the interconnect group M38*a* may be coupled to an interconnect Lα in a layer MLα of an interconnect group M26. That is, an interconnect L that extends across the RAM 412 between the upper end input and output circuit 417 and the core control circuit 413 may be provided.

<2-2> Advantages

According to the second embodiment, the control circuit 141 is provided with the lower end input and output circuit 414 and the upper end input and output circuit 417. Further, the interconnect regions 146-1, 146-2, 146-3, 146-4, 146-21, 146-22, 146-23, and 146-24 are disposed on the upper and lower sides of the control circuit 141 along the D2 axis. Thus, part of the transmission and reception of signals, which is performed through the left end input and output circuit 415 and the right end input and output circuit 416 in the comparative example, can be performed through the lower end input and output circuit 414 and the upper end input and output circuit 417. Thus, the number of interconnects that need to be disposed over the signal generation circuit 411 in the second embodiment is smaller than that in the comparative example. As a result, the restriction on the reduction in the size of the peripheral circuit 140 in the second embodiment is smaller than the restriction in the comparative example. Thus, it is possible to provide the NAND type flash memory 1 that can be made smaller because of the same reason as the first embodiment.

Note that a circuit that can be disposed in sections corresponding to the interconnect regions 146-21, 146-22, 146-23, and 146-24 in the comparative example cannot be disposed in the interconnect regions 146-21, 146-22, 146-23, and 146-24. However, stabilizing capacitors can be disposed. The disposed stabilizing capacitors can be utilized as stabilizing capacitors for a power supply of the control circuit 141 itself.

<2-3> Modification

FIG. 18 illustrates a part of a control circuit 141 of a modification of the second embodiment and the surroundings thereof along the D1 axis and the D2 axis, and further illustrates interconnects for electrically coupling components to each other. As illustrated in FIG. 18, the interconnect region 146-22 of FIG. 16 is not provided. Instead, an interconnect region 146-21 is located between the interconnect region 146-23 and the interconnect region 146-24.

The upper end input and output circuit 417 is located on the upper side of the signal generation circuit 411 and the RAM 412, and extends over between the left end input and output circuit 415 and the right end input and output circuit 416. Based on such a layout, the interconnect group M31 is located not only above the RAM 412, but also above the signal generation circuit 411. The upper end input and output circuit 417 shares an interconnect group M38*b* with the signal generation circuit 411. That is, a section (e.g., one end) of each interconnect L of the interconnect croup M38*b* is located inside the signal generation circuit 411, and another section (e.g., the other end) thereof is located inside the upper end input and output circuit 417. The interconnect group M38*b* extends along the D2 axis. The interconnect group M38*b* is made of any one or more of interconnects L of the first interconnects L1, the second interconnects L2, the third interconnects L3, and the fourth interconnects L4. Some interconnects L of the interconnect group M38*b* may be electrically coupled to components in the signal generation circuit 411 and components in the upper end input and output circuit 417 through contacts C.

<3> Modification

In the above-described embodiments, the bit line hook-up circuit 120 and the sense amplifier 130 are separate components. However, the bit line hook-up circuit 120 and the sense amplifier 130 may be configured as a single component.

In the embodiments, the voltage applied to a word line selected for the A-level read operation is, for example, between 0V and 0.55V. The voltage is not limited thereto, and may be any one of between 0.1V and 0.24V, between 0.21V and 0.31V, between 0.31V and 0.4V, between 0.4V to 0.5V, and between 0.5V and 0.55V.

The voltage applied to a word line selected for a B-level read operation is, for example, between 1.5V and 2.3V. The voltage is not limited thereto, and may be any one of between 1.65 V and 1.8 V, between 1.8V and 1.95V, between 1.95V and 2.1V, and between 2.1V and 2.3V.

The voltage applied to a word line selected for a C-level read operation is, for example, 3.0V and 4.0V. The voltage is not limited thereto, and may be any one of between 3.0V and 3.2V, between 3.2V and 3.4V, between 3.4V and 3.5V, between 3.5V and 3.6V, and between 3.6V and 4.0V.

The time for the read operation (tR) may be, for example, between 25 μs and 38 μs, between 38 μs and 70 μs, or between 70 μs to 80 μs.

A write operation includes a program operation and a verification operation as described above. In the write operation, the voltage first applied to a word line selected for the program operation is, for example, between 13.7V and 14.3V. The voltage is not limited thereto, and may be either one of between 13.7V and 14.0V and between 14.0V and 14.6V.

The voltage first applied to a selected word line in a writing into an odd word line may differ from the voltage first applied to a selected word line in a writing into an even word line. When an Incremental Step Pulse Program (ISPP) is used for the program operation, the voltage may be stepped up by approximately 0.5V, for example.

The voltage applied to unselected word lines is, for example, between 6.0V and 7.3V. The voltage is not limited thereto, and may be, for example, between 7.3V and 8.4V or may be 6.0V or less. The pass voltage to be applied may be changed depending on whether an unselected word line is an odd word line or an even word line.

The time for the write operation (tProg) may be, for example, between 1700 μs and 1800 μs, between 1800 μs and 1900 μs, or between 1900 μs to 2000 μs.

In the erase operation, the voltage first applied to a well, which is formed in a top area of the semiconductor substrate and above which the memory cells are arranged, is, for example, between 12V and 13.6V. The voltage is not limited thereto, and may be, for example, between 13.6V and 14.3V, between 14.8V and 19.0V, between 19.0V and 19.8V, or between 19.8V and 21V.

The time for the erase operation (tErase) may be, for example, between 3000 µs and 4000 µs, between 4000 µs and 5000 µs, or between 4000 µs and 9000 µs.

A memory cell may have a charge accumulation layer disposed on the semiconductor substrate (silicon substrate) via a tunnel insulation film of a thickness of 4 nm to 10 nm. The charge accumulation layer may have a stacked structure including an insulation film of SiN or SiON of a thickness of 2 nm to 3 nm and polysilicon of a thickness of 3 nm to 8 nm. The polysilicon may include a metal such as Ru. The memory cell includes an insulation film on the charge accumulation layer. This insulation film includes, for example, a silicon oxide film of a thickness of 4 nm to 10 nm between a lower high-k film of a thickness of 3 nm to 10 nm and an upper high-k film of a thickness of 3 nm to 10 nm. The high-k film includes, for example, HfO. The silicon oxide film can be greater in thickness than the high-k film. A control electrode of a thickness of 30 nm to 70 nm is formed on the insulation film with a material for work function adjustment of a thickness of 3 nm to 10 nm interposed therebetween. Here, the material for work function adjustment includes a metal-oxide film such as TaO or a metal-nitride film such as TaN. For example, W can be used for the control electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory cell array that includes a first select transistor, a memory cell, and a second select transistor;
   a bit line that is connected to the first select transistor;
   a sense amplifier that senses voltages of the bit line;
   a first pad region that includes a first pad;
   a second pad region that includes a second pad;
   a control circuit that is located between the first pad region and the second pad region and includes a first end and a second end that are opposed to each other;
   a first interconnect region that includes a first interconnect that includes a first section extended to a first direction and a second section extended to a second direction perpendicular to the first direction, the first section and the second section are coupled to each other; and
   a second interconnect region that includes a second interconnect that includes a third section extended to the first direction and a fourth section extended to the second direction, the third section and the fourth section are coupled to each other, wherein:
   the first section is connected to the first end, the second section is connected to the first pad region, the third section is connected to the second end, and the fourth section is connected to the second pad.

2. The device according to claim 1, further comprising a third interconnect region between the first pad region and the second pad region, the third interconnect region including a third interconnect that includes a fifth section.

3. The device according to claim 2, wherein:
   the third interconnect region is located between an end of the control circuit and an end of the semiconductor device.

4. The device according to claim 2, wherein:
   the fifth section is extended from an extension line of the first end of the control circuit to an extension line of the second end of the control circuit.

5. The device according to claim 2, wherein:
   the first pad region, the second pad region, and the third interconnect region are located on an end of the semiconductor memory device.

6. The device according to claim 2, wherein:
   the third interconnect region includes no transistor and includes no contact coupled to a substrate.

7. The device according to claim 1, wherein:
   the control circuit comprises a contact coupled to a substrate.

8. The device according to claim 1, wherein:
   the first interconnect region includes no transistor and includes no contact coupled to a substrate, and
   the second interconnect region includes no transistor and includes no contact coupled to the substrate.

* * * * *